United States Patent
Kim et al.

(10) Patent No.: US 11,613,694 B2
(45) Date of Patent: Mar. 28, 2023

(54) QUANTUM DOT-POLYMER COMPOSITE FILM, METHOD OF MANUFACTURING THE SAME, AND DEVICE INCLUDING THE SAME

(71) Applicants: SAMSUNG ELECTRONICS CO., LTD., Suwon-si (KR); Samsung Display Co., Ltd, Yongin-si (KR); SAMSUNG SDI CO., LTD., Yongin-si (KR)

(72) Inventors: Tae Gon Kim, Hwaseong-si (KR); Ha Il Kwon, Suwon-si (KR); Shin Ae Jun, Seongnam-si (KR)

(73) Assignees: SAMSUNG ELECTRONICS CO., LTD., Gyeonggi-Do (KR); SAMSUNG DISPLAY CO., LTD., Gyeonggi-Do (KR); SAMSUNG SDI CO., LTD., Gyeonggi-Do (KR)

( * ) Notice: Subject to any disclaimer, the term of this patent is extended or adjusted under 35 U.S.C. 154(b) by 44 days.

(21) Appl. No.: 17/346,793

(22) Filed: Jun. 14, 2021

(65) Prior Publication Data
US 2021/0301200 A1    Sep. 30, 2021

Related U.S. Application Data

(62) Division of application No. 15/787,214, filed on Oct. 18, 2017, now Pat. No. 11,034,884.

(30) Foreign Application Priority Data

Oct. 19, 2016    (KR) .......................... 10-2016-0136016

(51) Int. Cl.
C09K 11/02    (2006.01)
G03F 7/00     (2006.01)
(Continued)

(52) U.S. Cl.
CPC .............. *C09K 11/025* (2013.01); *C08K 3/00* (2013.01); *C09D 5/22* (2013.01); *C09K 11/883* (2013.01);
(Continued)

(58) Field of Classification Search
CPC ........................... C09K 11/025; H01L 33/502
See application file for complete search history.

(56) References Cited

U.S. PATENT DOCUMENTS 9,082,982 B2   7/2015   Jun et al.
9,778,510 B2   10/2017  Won et al.
(Continued)

FOREIGN PATENT DOCUMENTS

CN   104513335 A   4/2015
CN   105388702 A   3/2016
(Continued)

OTHER PUBLICATIONS

English Translation of Office Action dated Jan. 28, 2022 of the corresponding Korean Patent Application No. 10-2017-0135978, 12 pp.

(Continued)

*Primary Examiner* — Cachet I Proctor
(74) *Attorney, Agent, or Firm* — Cantor Colburn LLP

(57) ABSTRACT

A quantum dot-polymer composite film includes: a plurality of quantum dots, wherein a quantum dot of the plurality of quantum dots includes an organic ligand on a surface of a the quantum dot; a cured product of a photopolymerizable monomer including a carbon-carbon unsaturated bond; and a residue including a residue of a high-boiling point solvent, a residue of a polyvalent metal compound, or a combination thereof.

19 Claims, 12 Drawing Sheets

(51) Int. Cl.
*C08K 3/00* (2018.01)
*C09D 5/22* (2006.01)
*C09K 11/88* (2006.01)
*G02B 5/20* (2006.01)
*G02F 1/1335* (2006.01)
*G03F 7/004* (2006.01)
*G03F 7/031* (2006.01)
*G03F 7/16* (2006.01)
*G03F 7/20* (2006.01)
*G03F 7/32* (2006.01)
*G03F 7/40* (2006.01)
*H01L 33/50* (2010.01)
*H01L 31/054* (2014.01)
*B82Y 20/00* (2011.01)
*B82Y 40/00* (2011.01)
*H01L 31/055* (2014.01)

(52) U.S. Cl.
CPC ....... *G02B 5/201* (2013.01); *G02F 1/133514* (2013.01); *G03F 7/00* (2013.01); *G03F 7/0007* (2013.01); *G03F 7/0044* (2013.01); *G03F 7/031* (2013.01); *G03F 7/162* (2013.01); *G03F 7/168* (2013.01); *G03F 7/2002* (2013.01); *G03F 7/322* (2013.01); *G03F 7/40* (2013.01); *H01L 33/502* (2013.01); *B82Y 20/00* (2013.01); *B82Y 40/00* (2013.01); *H01L 31/055* (2013.01); *H01L 31/0547* (2014.12); *H01L 2933/0033* (2013.01); *H01L 2933/0041* (2013.01); *Y10S 977/774* (2013.01); *Y10S 977/783* (2013.01); *Y10S 977/818* (2013.01); *Y10S 977/824* (2013.01); *Y10S 977/897* (2013.01); *Y10S 977/95* (2013.01)

(56) References Cited

U.S. PATENT DOCUMENTS

| | | |
|---|---|---|
| 9,988,559 B2 | 6/2018 | Eckert et al. |
| 10,001,671 B2 | 6/2018 | Won et al. |
| 11,126,028 B2 | 9/2021 | Jang et al. |
| 2006/0134931 A1* | 6/2006 | Lin ........................ H01L 29/127 |
| | | 257/E29.071 |
| 2015/0083970 A1 | 3/2015 | Koh et al. |
| 2015/0098212 A1 | 4/2015 | Won et al. |
| 2015/0228697 A1* | 8/2015 | Liu ........................ H01L 27/322 |
| | | 438/23 |
| 2015/0298432 A1 | 10/2015 | Kim et al. |
| 2016/0005932 A1* | 1/2016 | Lee ........................ H01L 51/502 |
| | | 252/301.36 |
| 2016/0011506 A1* | 1/2016 | Gu ........................... G03F 7/029 |
| | | 430/281.1 |
| 2016/0340553 A1 | 11/2016 | Eckert et al. |
| 2018/0044586 A1* | 2/2018 | Kwon .................... H01L 33/34 |

FOREIGN PATENT DOCUMENTS

| | | |
|---|---|---|
| CN | 105829103 A | 8/2016 |
| CN | 103059393 A | 4/2017 |
| EP | 2584623 A2 | 4/2013 |
| KR | 1020130044071 A | 5/2013 |
| KR | 1020130115771 A | 10/2013 |
| KR | 1020140060209 A | 5/2014 |
| KR | 1020160028858 A | 3/2016 |
| WO | 2013160652 A1 | 10/2013 |
| WO | 2016035602 A1 | 3/2016 |

OTHER PUBLICATIONS

Office Action dated Jan. 28, 2022 of the corresponding Korean Patent Application No. 10-2017-0135978, 8 pp.
English Language Translation of Office Action dated Jun. 6, 2022, issued in the corresponding Chinese Patent Application No. 201710977354.5, 12 pp.
Office Action dated Jun. 6, 2022, issued in the corresponding Chinese Patent Application No. 201710977354.5, 10 pp.
Notice of Allowance dated Dec. 28, 2022 of the corresponding Korean Patent Application No. 10-2017-0135978.
Office Action dated Dec. 9, 2022, of the corresponding Chinese Patent Application No. 201710977354.5.

* cited by examiner

QUANTUM DOT-POLYMER COMPOSITE FILM, METHOD OF MANUFACTURING THE SAME, AND DEVICE INCLUDING THE SAME

CROSS-REFERENCE TO RELATED APPLICATIONS

This is a divisional application that claims priority to U.S. application Ser. No. 15/787,214 filed Oct. 18, 2017, now U.S. Pat. No. 11,034,884, which in turn claims priority to Korean Patent Application No. 10-2016-0136016 filed in the Korean Intellectual Property Office on Oct. 19, 2016, and all the benefits accruing therefrom under 35 U.S.C. §§ 119; 120, the contents of which are herein incorporated by reference in their entirety.

BACKGROUND

1. Field

A quantum dot-polymer composite film, a method of manufacturing the same, and a device including the same are disclosed.

2. Description of the Related Art

A quantum dot (semiconductor nanocrystal) may have different energy bandgaps by controlling sizes and compositions of nanocrystals, and thus may emit light of various photoluminescence wavelengths. As the quantum dot has a theoretical quantum yield ("QY") of 100% and emits light having a high color purity (e.g., a full width at half maximum ("FWHM") of less than or equal to about 40 nm), the quantum dot as a light emitting material may realize increased luminescent efficiency and improved color reproducibility. In a wet chemical method, organic materials such as a dispersing agent are coordinated on the surface of semiconductor crystal during crystal growth. As a result, quantum dots having uniformly controlled sizes and having good photoluminescence characteristics and stability may be provided.

SUMMARY

An embodiment provides a quantum dot-polymer composite film capable of preventing degradation of a quantum dot.

An embodiment provides a method of manufacturing the quantum dot-polymer composite film.

An embodiment provides a device including the quantum dot-polymer composite film.

According to an embodiment, a quantum dot-polymer composite film includes: a plurality of quantum dots, wherein a quantum dot of the plurality of quantum dots includes an organic ligand on a surface of the quantum dot; a cured product of a photopolymerizable monomer including a carbon-carbon unsaturated bond; and a residue including a residue of a high-boiling point solvent, a residue of a polyvalent metal compound, or a combination thereof.

The quantum dot may include a Group II-VI compound, a Group III-V compound, a Group IV-VI compound, a Group IV element or compound, a Group compound, a Group I-II-IV-VI compound, or a combination thereof.

The organic ligand may include $RC(=O)OH$, $RC(=O)OM$, $RNH_2$, $R_2NH$, $R_3N$, $RSH$, $RSM$, $R_3PO$, $R_3P$, $ROH$, $RP(=O)(OH)_2$, $R_2P(=O)OH$, $R_2NC(=S)SM$ (wherein each R is independently a C5 to C24 alkyl group, a C5 to C24 alkenyl group, or a C6 to C20 aryl group and M is a monovalent metal), a polymer organic ligand, or a combination thereof.

The photopolymerizable monomer including the carbon-carbon unsaturated bond may include a di(meth)acrylate compound, a tri(meth)acrylate compound, a tetra(meth) acrylate compound, a penta(meth)acrylate compound, a hexa(meth)acrylate compound, or a combination thereof.

The cured product of the photopolymerizable monomer including the carbon-carbon unsaturated bond may be a cured product of the photopolymerizable monomer including a carbon-carbon unsaturated bond and a thiol compound having at least two thiol groups.

The high-boiling point solvent may be a compound having a boiling point of about 200° C. to about 350° C., for example about 250° C. to about 330° C. or about 250° C. to about 300° C.

The high-boiling point solvent may include a C6 to C20 aliphatic hydrocarbon compound, a C6 to C20 ether compound, a C6 to C20 amine compound, a C6 to C20 alcohol compound, a carbitol-based compound, vacuum grease, an ionic liquid, or a combination thereof. Specifically, the high-boiling point solvent may include an aliphatic hydrocarbon compound including octadecene, dodecene, and tetradecane; an ether compound including from octyl ether and phenyl ether; an amine-based compound including trioctyl amine, oleyl amine, diethanol amine, and triethanol amine; an alcohol compound including oleyl alcohol, glycerine, diethylene glycol, and tripropylene glycolmethylether; a carbitol based solvent including ethyl carbitol acetate and butyl carbitol acetate; vacuum grease including polysiloxane oil, silicone oil, fluorine oil, and hydrocarbon oil; an ionic liquid including a cation including imidazolium, pyridinium, pyrrolidinium, ammonium, piperidinum, phosphonium, and sulfonium; or a combination thereof.

The polyvalent metal compound may include Zn, In, Ga, Mg, Ca, Sc, Sn, Ti, V, Cr, Mn, Fe, Co, Ni, Cu, Sr, Y, Zr, Nb, Mo, Cd, Ba, Au, Hg, Tl, or a combination thereof.

The polyvalent metal compound may include an organometallic compound, an organic salt, an inorganic salt, or a combination thereof.

The polyvalent metal compound may include a metal halide, a metal alkylate, a metal carboxylate, a metal (meth) acrylate, a metal dialkyl dithiocarbamate, a metal chalcogenide, or a combination thereof.

The polyvalent metal compound may include a metal chloride such as zinc chloride, indium chloride, cadmium chloride, aluminum chloride, iron chloride, or manganese chloride; metal alkylate such as diethyl zinc, dipropyl zinc, dibutyl zinc, triethyl aluminum, or tributyl aluminum; an organometallic compound such as zinc carboxylate, for example zinc acetate, zinc acrylate, zinc diethyl dithiocarbamate, or indium acetate, or a combination thereof.

The quantum dot-polymer composite film may further include a polymeric binder. The polymeric binder may include an acryl-based polymeric binder, a cardo-based polymeric binder, or a combination thereof.

The polymeric binder may have an acid value of about 30 milligrams KOH/gram to about 200 milligrams KOH/gram, for example about 50 milligrams KOH/gram to about 150 milligrams KOH/gram.

The polymeric binder may have a weight average molecular weight of about 1,000 grams per mole to about 150,000 grams per mole (g/mol).

The quantum dot-polymer composite film may further include a light scatterer including a metal oxide particle, a metal particle, or a combination thereof. Herein, a dispersing agent may be further added in order to increase dispersibility of the light scatterer.

The quantum dot-polymer composite film may include about 1 weight percent (wt %) to about 50 wt % of the quantum dot; about 0.5 wt % to about 30 wt % of the cured product of the photopolymerizable monomer; and about 0.01 to about 15 wt % of the residue, based on a total weight of the quantum dot-polymer composite film.

The quantum dot-polymer composite film may include the residue of the polyvalent metal compound and the polymeric binder may include a carboxylate ion group (—C(=O)O$^-$).

According to an embodiment, a method of manufacturing a quantum dot-polymer composite film includes: disposing a photosensitive composition including a plurality of quantum dots on a surface, wherein a quantum dot of the plurality of quantum dots includes an organic ligand on a surface of the quantum dot, a photopolymerizable monomer including a carbon-carbon unsaturated bond, a photoinitiator, and a solvent, on a substrate followed by drying to obtain a film; exposing the film under a mask to form a patterned film; developing the film; disposing a material including a high-boiling point solvent, a polyvalent metal compound solution, or a combination thereof on the patterned film to form a liquid barrier layer; and heat-treating the patterned film on which the liquid barrier layer is formed to manufacture the quantum dot-polymer composite film.

The method may further include disposing a film or a foil on the liquid barrier layer.

The heat-treating may include a temperature of greater than or equal to about 120° C. and less than about 200° C.

The photosensitive composition may further include a polymeric binder, a light scatterer, or a combination thereof.

The quantum dot, the photopolymerizable monomer including the carbon-carbon unsaturated bond, the polymeric binder, and the light scatterer may be the same as described in the quantum dot-polymer composite film.

An embodiment provides a color filter including the quantum dot-polymer composite film.

An embodiment provides a device including the quantum dot-polymer composite film.

The quantum dot-polymer composite film does not encounter deterioration of luminous efficiency of a quantum dot even after a photolithography process.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
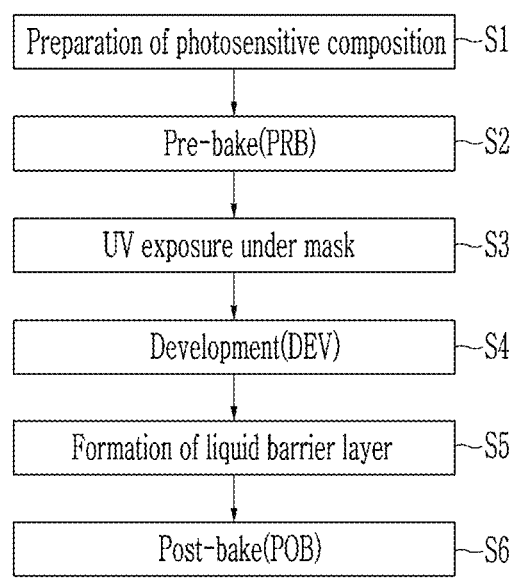
FIG. 1 shows an exemplary embodiment of a process for manufacturing a pattern for a color filter using a photosensitive composition (photoresist)

Advantages and characteristics of this disclosure, and a method for achieving the same, will become evident referring to the following example embodiments together with the drawings attached hereto. The embodiments, may, however, be embodied in many different forms and should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising", will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers, and/or sections, these elements, components, regions, layers, and/or sections should not be limited by these terms. These terms are only used to distinguish one element, component, region, layer, or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, the term "substituted" refers to replacement of hydrogen of a compound or a group by a substituent including a C1 to C30 alkyl group, a C2 to C30 alkenyl group, a C2 to C30 alkynyl group, a C6 to C30 aryl group, a C7 to C30 alkylaryl group, C1 to C30 alkoxy group, C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—ON), an amino group (—NRR' wherein R and R' are independently hydrogen or a C1 to C6 alkyl group), an azido group (—N$_3$), an amidino group (—O(=NH)NH$_2$), a hydrazino group (—NHNH$_2$), a hydrazono group (=N(NH$_2$), an aldehyde group (—C(=O)H), a carbamoyl group (—C(O)NH$_2$), a thiol group (—SH), an ester group (—O(=O)OR, wherein R is a C1 to C6 alkyl group or a C6 to C12 aryl group), a carboxyl group (—COOH) or a salt thereof (—O(=O)OM, wherein M is an organic or inorganic cation), a sulfonic acid group (—SO$_3$H) or a salt thereof (—SO$_3$M, wherein M is an organic or inorganic cation), phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, the term "alkylene group" refers to a straight or branched saturated aliphatic hydrocarbon group having at least two valences, optionally substituted with one or more substituents.

As used herein, the term "arylene group" refers to a functional group having at least two valences of obtained by removal of at least two hydrogens in an aromatic ring, optionally substituted with one or more substituents.

As used herein, when a definition is not otherwise provided, the term "alkyl" refers to a C1 to C30 linear or branched alkyl.

As used herein, the term "aromatic organic group" refers to a C6 to C40, for example a C6 to C30 aryl group or a C6 to C20 aryl group or a C2 to C30 heteroaryl group, for example a C2 to C20 heteroaryl group.

As used herein, the term "aliphatic hydrocarbon group" refers to a C1 to C10 alkyl group, a C2 to C10 alkenyl group, or a C2 to C10 alkynyl group and the term "alicyclic hydrocarbon group" refers to a C3 to C20 cycloalkyl group, a C3 to C20 cycloalkenyl group, or a C3 to C20 cycloalkynyl group.

As used herein, the term "(meth)acrylate" refers to acrylate and/or methacrylate.

As used herein, the term "visible light" refers to light having a wavelength of about 390 nm to about 700 nm and the term ultraviolet ("UV") refers to light having a wavelength of about 200 nm to about 400 nm.

As used herein, the term "combination thereof" refers to a mixture, a laminate, a copolymer, an alloy, and the like of at least two components.

Quantum dots are a nano-sized particle, and photoluminescence characteristics and stability of the quantum dots may easily affected by an external environment. Accordingly, the quantum dots are dispersed in a medium in a solid state (e.g., a polymer matrix) to form a quantum dot-polymer composite, and this composite is applied to various electronic devices such as displays and illuminating device. However, during a manufacturing process (e.g., heat treatment) into a composite, the original photoluminescence characteristics of the quantum dots may be largely deteriorated. Accordingly, development of technology capable of producing the quantum dot-polymer composite or patterning it without deteriorating original properties of the quantum dots is required.

In an embodiment, a quantum dot-polymer composite film includes a plurality of quantum dots, wherein a quantum dot of the plurality of quantum dots includes an organic ligand on a surface of the quantum dot; a cured product of a photopolymerizable monomer including a carbon-carbon unsaturated bond; and a residue including a residue of a high-boiling point solvent, a residue of a polyvalent metal compound, or a combination thereof.

As used herein, "Group" refers to a Group of Periodic Table.

As used herein, "Group II" refers to Group IIA and a Group IIB, and examples of the Group II metal may include Cd, Zn, Hg, and Mg, but are not limited thereto.

"Group III" refers to a Group IIIA and a Group IIIB, and examples of the Group III metal may include Al, In, Ga, and Tl, but are not limited thereto.

"Group IV" refers to a Group IVA and a Group IVB, and examples of the Group IV metal may include Si, Ge, and Sn but are not limited thereto. As used herein, the term "a metal" may include a semi-metal such as Si.

"Group I" refers to a Group IA and a Group IB, and may include Li, Na, K, Ru, and Cs but are not limited thereto.

"Group V" refers to Group VA and may include nitrogen, phosphorus, arsenic, antimony, and bismuth but is not limited thereto.

"Group VI" refers to Group VIA and may include sulfur, selenium, and tellurium, but is not limited thereto. The quantum dot is not particularly limited and may be a commercially available quantum dot. For example, the quantum dot may include a Group II-VI compound, a Group III-V compound, a Group IV-VI compound, a Group IV element or compound, a Group compound, a Group I-II-IV-VI compound, or a combination thereof. The Group II-VI compound may include a binary element compound including CdSe, CdTe, ZnS, ZnSe, ZnTe, ZnO, HgS, HgSe, HgTe, MgSe, MgS, and a mixture thereof; a ternary element compound including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary element compound including HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The Group III-V compound may be including a binary element compound including GaN, GaP, GaAs, GaSb, AlN, AlP, AlAs, AlSb, InN, InP, InAs, InSb, and a mixture thereof; a ternary element compound including GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a quaternary element compound including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group IV-VI compound may include a binary element compound including SnS, SnSe, SnTe, PbS, PbSe, PbTe, and a mixture thereof; a ternary element compound including SnSeS, SnSeTe, SnSTe, PbSeS, PbSeTe, PbSTe, SnPbS, SnPbSe, SnPbTe, and a mixture thereof; and a quaternary element compound including SnPbSSe, SnPbSeTe, SnPbSTe, and a mixture thereof. The Group compound may include $CuInSe_2$, $CuInS_2$, CuInGaSe, and CuInGaS but is not limited thereto. The Group I-II-IV-VI compound may include CuZnSnSe and CuZnSnS but is not limited thereto. The Group IV element or compound may include an elementary substance including Si, Ge, and a mixture thereof; and a binary element compound including SiC, SiGe, and a mixture thereof.

The binary element compound, the ternary element compound or the quaternary element compound respectively exist in a uniform concentration in the quantum dot particle or partially different concentrations in the same particle. In addition, the quantum dot may have a core-shell structure wherein a quantum dot surrounds another (different) quantum dot. The core and shell may have an interface, and an element of at least one of the core or the shell in the interface may have a concentration gradient wherein the concentration of the element(s) may decrease from of the shell toward the core. In addition, the quantum dot may have one core of a semiconductor nanocrystal and multi-shells surrounding the core. The multi-shell structure may have at least two shells wherein each shell may be a single composition, an alloy, or the one having a concentration gradient.

In the quantum dot particle, the materials of the shell may have a larger energy bandgap than that of the core, and thereby the quantum dot may exhibit a quantum confinement effect more effectively. In case of a multi-shell type of a quantum dot particle, the bandgap of the material of an outer shell may have higher energy than that of the material of an inner shell (a shell that is closer to the core). In this case, the quantum dot may emit light of a wavelength ranging from UV to infrared light.

The quantum dot may have quantum efficiency of greater than or equal to about 10%, greater than or equal to about 30%, for example, greater than or equal to about 50%, greater than or equal to about 60%, greater than or equal to about 70%, or greater than or equal to about 90%.

The quantum dot may have a narrower full-width at half-maximum (FWHM) so as to provide enhanced color purity (or color reproducibility) in a display. The quantum dot may have a FWHM of less than or equal to about 45 nanometers (nm), for example less than or equal to about 40 nm, or less than or equal to about 30 nm. Within such ranges, a device including the quantum dot may have enhanced color purity or improved color reproducibility.

The quantum dot may have a particle diameter (an average largest particle diameter for a non-spherical shape) of about 1 nanometer (nm) to about 100 nm. For example, the quantum dot may have a particle diameter (an average largest particle diameter for a non-spherical shape) of about 1 nm to about 20 nm, for example about 2 nm to about 15 nm or about 3 nm to about 15 nm.

The shape of the quantum dot may have any suitable shape and is not particularly limited. For example, the quantum dot may have spherical, pyramidal, multi-armed, or cubic nanoparticles, nanotubes, nanowires, nanofibers, nanoplate particles, or the like.

The quantum dot may be commercially available or may be synthesized according to any method. For example, several nano-sized quantum dot may be synthesized according to a wet chemical process. In the wet chemical process, precursors react in an organic solvent to grow nanocrystal particles, and the organic solvent or a ligand compound may coordinate on the surface of the semiconductor nanocrystal, controlling the growth of the nanocrystal. Examples of the organic solvent and ligand compound are known. The organic solvent which is not coordinated on the surface of the quantum dot may affect stability of a device, and thus excess organic materials that are not coordinated on the surface of the quantum dot may be removed by pouring it in excessive non-solvent, and centrifuging the resulting mixture. Examples of the non-solvent may be acetone, ethanol, methanol, and the like, but are not limited thereto. After the removal of extra organic materials, the amount of the organic materials coordinated on the surface of the quantum dot may be less than or equal to about 50% by weight (wt %), for example, less than or equal to about 30 wt %, less than or equal to about 20 wt % or less than or equal to about 10 wt %, based on a total weight of the quantum dots. The organic material may include a ligand compound, an organic solvent, or a combination thereof.

The quantum dot includes an organic ligand bound on a surface thereof. The organic ligand may include $RC(=O)OH$, $RC(=O)OM$, $RNH_2$, $R_2NH$, $R_3N$, $RSH$, $RSM$, $R_3PO$, $R_3P$, $ROH$, $RP(=O)(OH)_2$, $R_2P(=O)OH$, $R_2NC(=S)SM$ (wherein R is independently a C5 to C24 alkyl group, a C5 to C24 alkenyl group, or a C6 to C20 aryl group and M is a monovalent metal, for example a Group 1 metal such as Na), a polymer organic ligand, or a combination thereof.

Specific examples of the organic ligand compound may be a carboxylic acid compound or an ester compound thereof such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, and the like; a thiol compound such as methane thiol, ethane thiol, propane thiol, butane thiol, pentane thiol, hexane thiol, octane thiol, dodecane thiol, hexadecane thiol, octadecane thiol, benzyl thiol, and the like; amines such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, trioctylamine, and the like; a phosphine compound such as methyl phosphine, ethyl phosphine, propyl phosphine, butyl phosphine, pentyl phosphine, octylphosphine, dioctyl phosphine, tributylphosphine, trioctylphosphine, and the like; a phosphine oxide compound such as methyl phosphine oxide, ethyl phosphine oxide, propyl phosphine oxide, butyl phosphine oxide, pentyl phosphine oxide, tributylphosphine oxide, octylphosphine oxide, dioctyl phosphine oxide, trioctylphosphine oxide, and the like; diphenyl phosphine, triphenyl phosphine compound or an oxide compound thereof; hexylphosphinic acid; a C5 to C20 alkyl phosphonic acid such as octylphosphonic acid, dodecyl phosphonic acid, tetradecyl phosphonic acid, hexadecyl phosphonic acid, octadecyl phosphonic acid, and the like, but is not limited thereto.

An amount of the quantum dot may be greater than or equal to about 1 wt %, for example, greater than or equal to about 5 wt %, or greater than or equal to about 10 wt %, based on a total weight of the quantum dot-polymer composite film. In addition, the amount of the quantum dot may be less than or equal to about 50 wt %, less than or equal to about 45 wt %, for example, less than or equal to about 40 wt %, based on a total weight of the quantum dot-polymer composite film.

As the quantum dot has a theoretical quantum efficiency ("QY") of 100% and may emit light having a high color purity (e.g., full width at half maximum ("FWHM") of less than or equal to about 40 nm), it may enhance a luminous efficiency and improve a color reproducibility. Thus, it may be expected that the color filter including the quantum dot-polymer composite film may provide a display having a high luminance, a wide viewing angle and a high color reproducibility.

The plurality of quantum dots may be dispersed (e.g., separated from each other) by the cured product of the photopolymerizable monomer including the carbon-carbon unsaturated bond.

The photopolymerizable monomer including the carbon-carbon unsaturated bond includes a carbon-carbon unsaturated bond and is not particularly limited as long as it is photopolymerizable. For example, the photopolymerizable monomer may be a monofunctional or multi-functional ester of (meth)acrylic acid including at least one ethylenic unsaturated double bond.

The photopolymerizable monomer including the carbon-carbon unsaturated bond may include a di(meth)acrylate compound, a tri(meth)acrylate compound, a tetra(meth)acrylate compound, a penta(meth)acrylate compound, a hexa(meth)acrylate compound, or a combination thereof.

Specific examples of the photopolymerizable monomer including the carbon-carbon unsaturated bond may be ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentylglycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, pentaerythritol hexa(meth)acrylate, bisphenol A epoxyacrylate, bisphenol A di(meth)acrylate, trimethylolpropanetri(meth)acrylate, novolacepoxy (meth)acrylate, ethylene glycolmonomethylether(meth)acrylate, tris(meth)acryloyloxyethyl phosphate, diethylene glycoldi(meth)acrylate, triethylene glycoldi(meth)acrylate, propylene glycoldi(meth)acrylate, but are not limited thereto. A photopolymerizable monomer according to an embodiment may include a di(meth)acrylate compound, a tri(meth)acrylate compound, tetra(meth)acrylate compound, a penta(meth)acrylate compound, a hexa(meth) acrylate compound, or a combination thereof.

An amount of the cured product of the photopolymerizable monomer including the carbon-carbon unsaturated bond may be greater than or equal to about 0.5 wt %, for example, greater than or equal to about 1 wt % or greater than or equal to about 2 wt %, based on a total weight of the quantum dot-polymer composite film. An amount of the photopolymerizable monomer may be less than or equal to about 30 wt %, for example less than or equal to about 20 wt %, or less than or equal to about 10 wt %, based on a total weight of the quantum dot-polymer composite film.

The cured product of the photopolymerizable monomer including the carbon-carbon unsaturated bond may be a cured product of a photopolymerizable monomer including a carbon-carbon unsaturated bond and a thiol compound having at least two thiol groups.

The thiol compound having at least two thiol groups may include a compound represented by Chemical Formula 1.

Chemical Formula 1

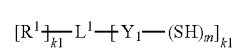

In Chemical Formula 1, $R^1$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a substituted or unsubstituted C1 to C10 alkoxy group; hydroxy group; —$NH_2$; a substituted or unsubstituted C1 to C30 amine group (—NRR', wherein R and R' are each independently hydrogen or a C1 to C30 linear or branched alkyl group, provided that R and R' are not hydrogen simultaneously); an isocyanate group; halogen; —ROR' (wherein R is a substituted or unsubstituted C1 to C20 alkylene group and R' is hydrogen or a C1 to C20 linear or branched alkyl group); an acyl halide group (—RC(=O)X, wherein R is a substituted or unsubstituted alkylene group and X is a halogen); —C(=O)OR' (wherein R' is hydrogen or a C1 to C20 linear or branched alkyl group); —CN, or —C(=O)ONRR' (wherein R and R' are independently hydrogen or a C1 to C20 linear or branched alkyl group), $L_1$ is carbon atom, a substituted or unsubstituted C1 to C30 alkylene group, a substituted or unsubstituted C6 to C30 cycloalkylene group, a substituted or unsubstituted C6 to C30 arylene group, a substituted or unsubstituted C3 to C30 heteroarylene group, or a substituted C2 to C30 alkylene group wherein at least one methylene (—CH$_2$—) is replaced by sulfonyl (—SO$_2$—), carbonyl (—CO—), ether (—O—), sulfide (—S—), sulfoxide (—SO—), ester (—C(=O)O—), amide (—C(=O)NR—) (wherein R is hydrogen or a C1 to C10 alkyl group), or a combination thereof, Y$_1$ is a single bond; a substituted or unsubstituted C1 to C30 alkylene group; a substituted or unsubstituted C2 to C30 alkenylene group; or a substituted C2 to C30 alkylene group or C3 to C30 alkenylene group wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, m is an integer of 1 or more, k1 is 0 or 1, k2 is an integer of 1 or more, and a sum of m and k2 is an integer of 3 or more, provided that when Y$_1$ is not a single bond, m does not exceed the valence of Y$_1$, and provided that a sum of k1 and k2 does not exceed the valence of L$_1$.

The thiol compound having at least two thiol groups may include a compound represented by Chemical Formula 1-1.

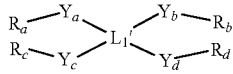

Chemical Formula 1-1

In Chemical Formula 1-1,

L$_1$' is carbon, a substituted or unsubstituted C2 to C20 alkylene group, a substituted or unsubstituted C6 to C30 arylene group; a substituted or unsubstituted C3 to C30 heteroarylene group; a substituted or unsubstituted C3 to C30 cycloalkylene group; or a substituted or unsubstituted C3 to C30 heterocycloalkylene group, Y$_a$ to Y$_d$ are independently a single bond; a substituted or unsubstituted C1 to C30 alkylene group; a substituted or unsubstituted C2 to C30 alkenylene group; or a substituted C2 to C30 alkylene group or C3 to C30 alkenylene group wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, and R$_a$ to R$_d$ are independently R$^1$ of Chemical Formula 1 or SH, provided that at least two of R$_a$ to R$_d$ are SH.

The thiol compound having at least two thiol groups may be ethoxylated pentaerythritol tetra(3-mercaptopropionate), trimethylolpropane tri(3-mercaptopropionate), trimethylolpropane tri(2-mercaptoacetate), glycoldi-3-mercaptopropionate, polypropyleneglycol 3-mercaptopropionate, ethoxylated trimethylolpropane tri(3-mercaptopropionate), glycoldimercapto acetate, ethoxylated glycoldimercapto acetate, 1,4-bis(3-mercaptobutyryloxy)butane, trimethylolpropanetris(3-mercaptopropionate), tris[2-(3-mercaptopropinonyloxy)ethyl] isocyanurate, 1,3,5-tris(3-mercaptobutyloxyethyl)-1,3,5-triazine-2,4,6(1H,3H,5H)-trione, pentaerythritol tetrakis(3-mercaptopropionate), pentaerythritol tetrakis(2-mercaptoacetate), 1,6-hexane dithiol, 1,3-propane dithiol, 1,2-ethane dithiol, polyethylene glycol dithiol including 1 to 10 ethylene glycol repeating units, or a combination thereof.

The high-boiling point solvent may be a compound having a boiling point of about 200° C. to about 350° C., for example about 250° C. to about 330° C. or about 250° C. to about 300° C. The solvent having the boiling point within the ranges may be coated on a surface of the quantum dot-polymer composite film during a photolithography process and may remain inside the film after subsequent processes, a post-bake process and a washing process.

The high-boiling point solvent may include a C6 to C20 aliphatic hydrocarbon compound, a C6 to C20 ether compound, a C6 to C20 amine compound, a C6 to C20 alcohol compound, a carbitol-based compound, vacuum grease, ionic liquid, or a combination thereof.

Specifically, the high-boiling point solvent may include an aliphatic hydrocarbon compound including octadecene, dodecene, and tetradecane; an ether compound including octyl ether and phenyl ether; an amine-based compound including trioctyl amine, oleyl amine, diethanol amine, and triethanol amine; an alcohol compound including oleyl alcohol, glycerine, diethylene glycol, and tripropylene glycolmethylether; a carbitol based solvent including ethyl carbitol acetate and butyl carbitol acetate; vacuum grease including polysiloxane oil, silicone oil, fluorine oil, and hydrocarbon-based oil; ionic liquid; or a combination thereof.

The ionic liquid refers to liquid including ions and may be generally a molten salt including a macrocation and a smaller anion. The ionic liquid is not particularly limited but a cation of the ionic liquid may include imidazolium represented by Chemical Formula 2A, pyridinium represented by Chemical Formula 2B, pyrrolidinium represented by Chemical Formula 2C, ammonium represented by Chemical Formula 2D, piperidinum represented by Chemical Formula 2E, phosphonium represented by Chemical Formula 2F, and sulfonium represented by Chemical Formula 2G.

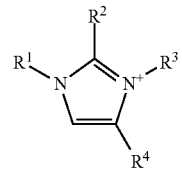

Chemical Formula 2A

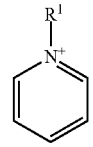

Chemical Formula 2B

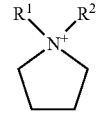

Chemical Formula 2C

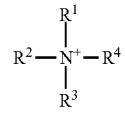

Chemical Formula 2D

-continued

Chemical Formula 2E

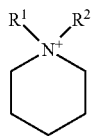

Chemical Formula 2F

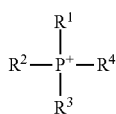

In Chemical Formulae 2A to 2G, $R^1$, $R^2$, $R^3$, and $R^4$ may each independently be a C1 to C30 linear or branched alkyl group.

In addition, an anion of the ionic liquid may include $Cl^-$, $Br^-$, $NO_3^-$, $BF_4^-$, $PF_6^-$, $AlCl_4^-$, $Al_2Cl_7^-$, $CH_3COO^-$, $CH_3COO^-$, $CF_3COO^-$, $CH_3SO_3^-$, $CF_3SO_3^-$, $(CF_3SO_2)_2N^-$, $(CF_3SO_2)_3C^-$, $(CF_3CF_2SO_2)_2N^-$, $C_4F_9SO_3^-$, $C_3F_7COO^-$, $(CF_3SO_2)(CF_3CO)N^-$, $C_4F_{10}N^-$, $C_2F_6NO_4S_2^-$, $C_2F_6NO_6S_2^-$, $C_4F_{10}NO_4S_2^-$, $CF_3SO_2^-$, $CF_3SO_3^-$, $C_4F_9SO_2^-$, $C_4F_9SO_3^-$, $C_2H_6NO_4S_2^-$, $C_3F_6NO_3S^-$, $CH_3CH(OH)CO_2^-$, and the like.

The ionic liquid may be for example 1-octyl-3-methylimidazolium [bis (trifluoromethylsulfonyl)imide]([Omim] ["TFSI"]) of Chemical Formula 3, 1-butyl-3-methylimidazolium] [bis(trifluoromethylsulfonyl) imide]([Bmim] [TFSI]) of Chemical Formula 4.

Chemical Formula 3

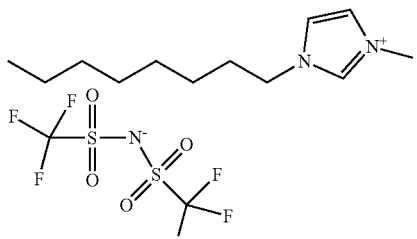

Chemical Formula 4

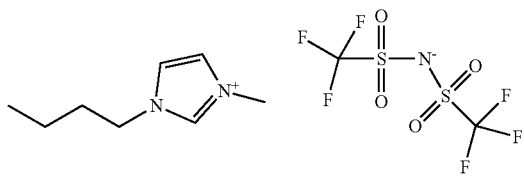

The polyvalent metal compound may include Zn, In, Ga, Mg, Ca, Sc, Sn, Ti, V, Cr, Mn, Fe, Co, Ni, Cu, Sr, Y, Zr, Nb, Mo, Cd, Ba, Au, Hg, Tl, or a combination thereof.

The polyvalent metal compound may include an organometallic compound, an organic salt, an inorganic salt, or a combination thereof.

The polyvalent metal compound may include a metal halide, a metalate alkyl, a metal carboxylate such as a metal acetate and the like, a metal (meth)acrylate, a metal dialkyl dithiocarbamate, a metal chalcogenide or a combination thereof. The metal halide may be a metal chloride, a metal bromide, a metal iodide, and the like.

The polyvalent metal compound may include a metal chloride such as zinc chloride, indium chloride, cadmium chloride, aluminum chloride, iron chloride, manganese chloride, and the like; metal alkylate such as diethyl zinc, dipropyl zinc, dibutyl zinc, triethyl aluminum, tributyl aluminum, and the like; an organometallic compound such as zinc carboxylate, for example zinc acetate, zinc acrylate, zinc diethyl dithiocarbamate, indium acetate, and the like; or a combination thereof.

In an embodiment, the quantum dot-polymer composite film may include about 1 wt % to about 50 wt % of the quantum dots; about 0.5 wt % to about 30 wt % of the cured product of the photopolymerizable monomer; and about 0.01 wt % to about 15 wt % of the residue, each based on a total weight of the quantum dot-polymer composite film.

In addition, the quantum dot-polymer composite film may further include a polymeric binder. In this case, the plurality of the quantum dots may be dispersed (e.g., separated from each other) in a matrix of the cured product of the photopolymerizable monomer including the carbon-carbon unsaturated bond and the polymeric binder.

The polymeric binder may include an acryl-based polymeric binder, a cardo-based polymeric binder, or a combination thereof.

The acryl-based polymeric binder may be a copolymer of a first unsaturated monomer and a second unsaturated monomer that may be copolymerizable therewith.

The first unsaturated monomer may be an unsaturated carboxylic acid or vinyl ester compound such as acrylic acid, methacrylic acid, maleic acid, itaconic acid, fumaric acid, 3-butenoic acid, vinyl acetate, vinyl benzoate, and the like but is not limited thereto. The first unsaturated monomer may be used alone or as a mixture of two or more compounds.

The second unsaturated monomer may be an alkenyl aromatic compound such as styrene, α-methyl styrene, vinyl toluene, vinyl benzyl methyl ether, and the like; an unsaturated carboxylic acid ester compound such as methyl (meth)acrylate, ethyl (meth)acrylate, butyl (meth)acrylate, benzyl (meth)acrylate, cyclohexyl (meth)acrylate, phenyl (meth)acrylate, and the like; an unsaturated carboxylic acid amino alkyl ester compound such as 2-amino ethyl (meth)acrylate, 2-dimethyl amino ethyl (meth)acrylate, N-phenylmaleimide, N-benzylmaleimide, N-alkylmaleimide, 2-dimethyl amino ethyl methacrylate, and the like; an unsaturated carboxylic acid glycidyl ester compound such as glycidyl (meth)acrylate, and the like; a vinyl cyanide compound such as (meth)acrylo nitrile, and the like; an unsaturated amide compound such as (meth)acryl amide, and the like; hydroxy alkyl (meth)acrylate such as 2-hydroxy ethyl (meth)acrylate, 2-hydroxy butyl (meth)acrylate, and the like, but is not limited thereto. The second unsaturated monomer may be used alone or as a mixture of two or more compounds.

Examples of the acryl-based polymeric binder may be a methacrylic acid/benzyl methacrylate copolymer, a methacrylic acid/benzyl methacrylate/styrene copolymer, a methacrylic acid/benzylmethacrylate/2-hydroxyethylmethacrylate copolymer, a methacrylic acid/benzylmethacrylate/styrene/2-hydroxyethylmethacrylate copolymer, and the like, but are not limited thereto. They may be used alone or as a mixture of two or more.

In the acryl-based polymeric binder, an amount of a first structural unit derived from the first unsaturated monomer may be greater than or equal to about 10 mol %, for example, greater than or equal to about 15 mol %, greater than or equal to about 20 mol %, or greater than or equal to about 25 mol %, based on a total weight of the polymeric binder. In the acryl-based polymeric binder, the amount of the first structural unit derived from the first unsaturated monomer may be less than or equal to about 45 mol %, for example, less than or equal to about 35 mol %, or less than or equal to about 30 mol %, based on a total weight of the polymeric binder.

In the acryl-based polymeric binder, an amount of a second structural unit derived from the second unsaturated monomer may be greater than or equal to about 10 mol %, for example, greater than or equal to about 15 mol %, greater than or equal to about 20 mol %, or greater than or equal to about 25 mol %, based on a total weight of the polymeric binder. In the acryl-based polymeric binder, the amount of the second structural unit derived from the second unsaturated monomer may be less than or equal to about 40 mol %, for example, less than or equal to about 35 mol %, or less than or equal to about 30 mol %, based on a total weight of the polymeric binder.

The polymeric binder may have a weight average molecular weight of about 1,000 to about 150,000 grams/mol (g/mol), for example about 3,000 to about 100,000 g/mol, about 5,000 to about 50,000 g/mol or about 2,000 to about 30,000 g/mol. When the weight average molecular weight of the polymeric binder is within the ranges, physical and chemical properties of the quantum dot-polymer composite film may be improved and viscosity may be appropriate, and close contacting properties with a substrate may be improved during manufacture of the quantum dot-polymer composite film.

The polymeric binder may have an acid value of about 30 milligrams of KOH per gram (mg KOH/g) to about 200 mg KOH/g, for example about 50 mg KOH/g to about 150 mg KOH/g. When the binder resin has an acid value within the range, a resolution of pixel pattern may be improved. The quantum dot may be mixed with the polymeric binder having an acid value within the range to form quantum dot-binder dispersion liquid, the quantum dot-binder dispersion liquid may exhibit improved compatibility with other components of the photosensitive composition (e.g., the photopolymerizable monomer, the photoinitiator, the solvent, and the like) to disperse the quantum dots in a resultant photosensitive composition well and to obtain a good pattern.

The cardo-based polymeric binder may be a polymer including a multiple aromatic ring having a carboxylic acid group (—COOH) and may include a structural unit represented by Chemical Formula 5.

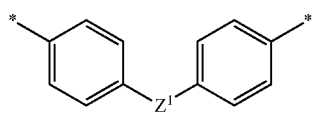

Chemical Formula 5

In Chemical Formula 5,

* is a linking point with an adjacent atom of the main chain of the polymeric binder, $Z^1$ is one of linking moieties represented by Chemical Formulae 5A to 5F, and in Chemical Formulae 5A to 5F, * is a linking point with an aromatic moiety:

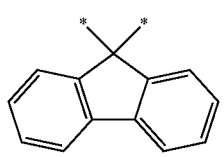

Chemical Formula 5A

-continued

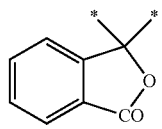

Chemical Formula 5B

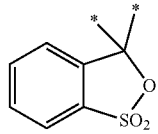

Chemical Formula 5C

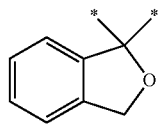

Chemical Formula 5D

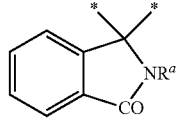

Chemical Formula 5E

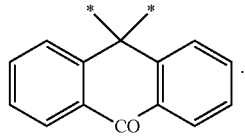

Chemical Formula 5F

In Chemical Formula 5E, $R_a$ is hydrogen, an ethyl group, $C_2H_4Cl$, $C_2H_4OH$, $CH_2CH=CH_2$, or a phenyl group.

The polymer including the multiple aromatic ring having the carboxylic acid group may include a structural unit represented by Chemical Formula 6.

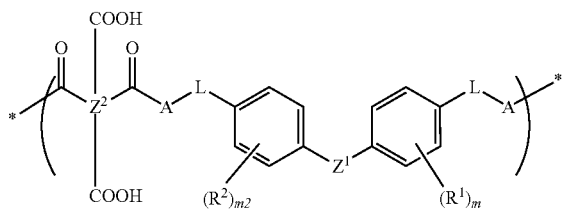

Chemical Formula 6

In Chemical Formula 6, $Z^1$ is one of linking moieties represented by Chemical Formulae 5A to 5F, L is independently a single bond, a C1 to C10 alkylene group, a C1 to C10 alkylene group including a substituent having a carbon-carbon unsaturated bond, a C1 to C10 oxy alkylene group, or a C1 to C10 oxy alkylene group including substituent having a carbon-carbon unsaturated bond, A is —NH—, —O—, or C1 to C10 alkylene, $Z^2$ is a C6 to C40 aromatic organic group, and m1 and m2 are independently an integer from 0 to 4.

In Chemical Formula 6, $Z^2$ may be one of linking moieties represented by 6A, 6B, and 6C.

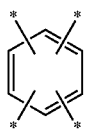

Chemical Formula 6A

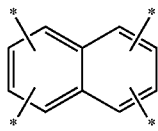

Chemical Formula 6B

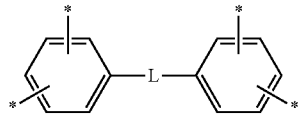

Chemical Formula 6C

In Chemical Formulae 6A, 6B, and 6C,

* is a linking point with carbonyl carbon, L is a single bond, —O—, —S—, —C(=O)—, —CH(OH)—, —S(=O)$_2$—, —Si(CH$_3$)$_2$—, —(CH$_2$)$_p$— (wherein 1≤p≤10), —(CF$_2$)$_q$— (wherein 1≤q≤10), —CR$^a$R$^b$— (wherein R$^a$ and R$^b$ are independently hydrogen, a C1 to C10 aliphatic hydrocarbon group, a C6 to C20 aromatic hydrocarbon group, or a C6 to C20 alicyclic hydrocarbon group), —C(CF$_3$)$_2$—, —C(CF$_3$)(C$_6$H$_5$)—, or —C(=O)NH—.

The polymer including the multiple aromatic ring having the carboxylic acid group may include a structural unit represented by Chemical Formula 7:

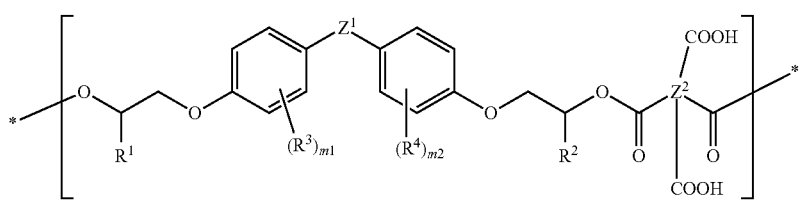

Chemical Formula 7

In Chemical Formula 7,

R$^1$ and R$^2$ are independently hydrogen or a substituted or unsubstituted (meth)acryloyloxyalkyl group, R$^3$ and R$^4$ are independently hydrogen, a halogen, or a substituted or unsubstituted C1 to C20 alkyl group, Z$^1$ is one of linking moieties represented by Chemical Formulae 5A to 5F, Z$^2$ is a C6 to C40 aromatic organic group, and m1 and m2 are independently an integer ranging from 0 to 4.

An amount of the polymeric binder may be greater than or equal to about 0.5 wt %, for example, greater than or equal to about 1 wt % or greater than or equal to about 5 wt % based on a total weight of the quantum dot-polymer composite film. In addition, the amount of the polymeric binder may be less than or equal to about 40 wt %, for example, less than or equal to about 35 wt % or less than or equal to about 30 wt % based on a total weight of the quantum dot-polymer composite film. Within the ranges, an appropriate developability and processability during a post pattern forming process may be realized while ensuring dispersion of quantum dots.

When the quantum dot-polymer composite film includes the residue of a polyvalent metal compound, the polymeric binder may include a carboxylate ion group (—C(=O)O$^-$). Without wishing to be bound by theory, it is believed that the carboxylate ion group (—C(=O)O$^-$) may be produced through binding a polyvalent metal ion produced by heat treatment of the polyvalent metal compound, with the polymeric binder inside the film.

The quantum dot-polymer composite film may further include a light scatterer including a metal oxide particle, a metal particle, or a combination thereof. The light scatterer may increase a refractive index of the composition so increase the possibility of incident light entered into the composition with quantum dots. The light scatterer may include inorganic oxide particles such as alumina, silica, zirconia, titania, zinc oxide, or metal particles such as gold, silver, copper, platinum and the like, but is not limited thereto. Herein, in order to increase dispersibility of the light scatterer, a dispersing agent may be added.

According to an embodiment, a method of manufacturing a quantum dot-polymer composite film includes coating a photosensitive composition including a plurality of quantum dots, wherein the quantum dot includes an organic ligand on a surface thereof, a photopolymerizable monomer including a carbon-carbon unsaturated bond, a photoinitiator, and a solvent, on a substrate followed by drying the same to obtain a film; exposing and developing the film under a mask to form a patterned film; and coating a material including a high-boiling point solvent, a polyvalent metal compound solution, or a combination thereof on the patterned film to form a liquid barrier layer; and heat-treating the patterned film on which the liquid barrier layer is formed.

A method of manufacturing the quantum dot-polymer composite film is described referring to FIG. 1. FIG. 1 is a flowchart showing a process for manufacturing a quantum dot-polymer composite film.

First, a photosensitive composition including the plurality of quantum dots, wherein the quantum dot includes an organic ligand on a surface thereof, the photopolymerizable monomer including a carbon-carbon unsaturated bond, the photoinitiator, and the solvent is prepared (S1). The quantum dot, the photopolymerizable monomer, the photoinitiator, the solvent, and the polymeric binder, the light scatterer, or other additives as needed of the photosensitive composition may be mixed according to a desirable mixing manner that is not particularly limited. For example, each component may be sequentially or simultaneously mixed.

The quantum dot, the photopolymerizable monomer including the carbon-carbon unsaturated bond, the polymeric binder, and the light scatterer may be the same as described above in the quantum dot-polymer composite film. Amounts thereof in the photosensitive composition may be determined considering amounts of each component in the quantum dot-polymer composite film.

Hereinafter, the photoinitiator and the solvent included in the photosensitive composition are described. The photoinitiator is not particularly limited and may be desirably selected. For example, the photoinitiator may include a triazine-based compound, an acetophenone-based compound, a benzophenone-based compound, a thioxanthone-based compound, a benzoin-based compound, an oxime-based compound, or a combination thereof, but is not limited thereto.

The triazine-based compound may include 2,4,6-trichloro-s-triazine, 2-phenyl-4,6-bis(trichloro methyl)-s-triazine, 2-(3',4'-dimethoxy styryl)-4,6-bis(trichloro methyl)-s-triazine, 2-(4'-methoxy naphthyl)-4,6-bis(trichloro methyl)-s-triazine, 2-(p-methoxy phenyl)-4,6-bis(trichloro methyl)-s-triazine, 2-(p-tolyl)-4,6-bis(trichloro methyl)-s-triazine, 2-biphenyl-4,6-bis(trichloro methyl)-s-triazine, 2,4-bis(trichloro methyl)-6-styryl-s-triazine, 2-(naphthalen-1-yl)-4,6-bis(trichloro methyl)-s-triazine, 2-(4-methoxy naphthalen-1-yl)-4,6-bis(trichloro methyl)-s-triazine, 2,4-bis(trichloro methyl)-6-piperonyl-s-triazine, or 2,4-bis(trichloro methyl)-6-(4'-methoxy styryl)-s-triazine, but is not limited thereto.

The acetophenone-based compound may include 2,2'-diethoxy acetophenone, 2,2'-dibutoxy acetophenone, 2-hydroxy-2-methyl propinophenone, p-t-butyl trichloro acetophenone, p-t-butyl dichloro acetophenone, 4-chloro acetophenone, 2,2'-dichloro-4-phenoxy acetophenone, 2-methyl-1-(4-(methylthio)phenyl)-2-morpholino propan-1-one, 2-benzyl-2-dimethyl amino-1-(4-morpholino phenyl)-butan-1-one, but is not limited thereto.

The benzophenone-based compound may include benzophenone, benzoyl benzoate, methyl benzoyl benzoate, 4-phenyl benzophenone, hydroxy benzophenone, acrylated benzophenone, 4,4'-bis(dimethyl amino)benzophenone, 4,4'-dichloro benzophenone, or 3,3'-dimethyl-2-methoxy benzophenone, but is not limited thereto.

The thioxanthone-based compound may include thioxanthone, 2-methyl thioxanthone, isopropyl thioxanthone, 2,4-diethyl thioxanthone, 2,4-diisopropyl thioxanthone, or 2-chloro thioxanthone, but is not limited thereto.

The benzoin-based compound may include benzoin, benzoin methyl ether, benzoin ethyl ether, benzoin isopropyl ether, benzoin isobutyl ether, or benzyl dimethyl ketal, but is not limited thereto.

The oxime-based compound may include 2-(O-benzoyloxime)-1-[4-(phenylthio)phenyl]-1,2-octandione or 1-(O-acetyloxime)-1-[9-ethyl-6-(2-methylbenzoyl)-9H-carbazol-3-yl]ethanone, but is not limited thereto.

A carbazole-based compound, a diketone compound, a sulfonium borate-based compound, a diazo-based compound, a biimidazole-based compound, and the like may be usable as a photoinitiator in addition to the photoinitiators.

In the photosensitive composition, an amount of the photoinitiator may be greater than or equal to about 0.01 wt %, for example, greater than or equal to about 0.1 wt %, or greater than or equal to about 1 wt % based on a total weight of the photosensitive composition. The amount of the photoinitiator may be less than or equal to about 10 wt %, for example, less than or equal to about 8 wt % based on a total weight of the photosensitive composition. In an embodiment, the amount of the photoinitiator may be about 0.05 wt % to about 10 wt % based on a total weight of solids (i.e., non-volatile components) of the photosensitive composition. Within the ranges, a pattern having desirable shapes may be obtained.

An amount of the solvent in the photosensitive composition may be determined considering the amounts of the other components (i.e., the quantum dot, the photopolymerizable monomer, the polymeric binder, and the photoinitiator). The photosensitive composition may include a balance amount of the solvent except amounts of desirable solids (non-volatiles). The solvent may be appropriately selected considering affinity for other components in the photosensitive composition (e.g., the photopolymerizable monomer, the photoinitiator, and the polymeric binder), affinity for alkali developing solution, and boiling points, and the like.

Examples of the solvent may be ethyl 3-ethoxy propionate; alkylene glycols such as ethylene glycol, diethylene glycol, or polyethylene glycol; glycolethers such as ethylene glycolmonomethylether, ethylene glycolmonoethylether, diethylene glycolmonomethylether, ethylene glycoldiethylether, or diethylene glycoldimethylether; glycoletheracetates such as ethylene glycolacetate, ethylene glycolmonoethyletheracetate, diethylene glycolmonoethyletheracetate, or diethylene glycolmonobutyletheracetate; propylene glycols such as propylene glycol; propylene glycolethers such as propylene glycolmonomethylether, propylene glycolmonoethylether, propylene glycolmonopropylether, propylene glycolmonobutylether, propylene glycoldimethylether, di propylene glycoldimethylether, propylene glycoldiethylether, or dipropylene glycoldiethylether; propylene glycoletheracetates such as propylene glycolmonomethyl ether acetate, or dipropylene glycolmonoethyletheracetate; amides such as N-methylpyrrolidone, dimethyl formamide, or dimethyl acetamide; ketones such as methylethylketone ("MEK"), methylisobutylketone ("MIBK"), or cyclohexanone; petroleums such as toluene, xylene, or solvent naphtha; esters such as ethyl acetate, butyl acetate, or ethyl lactate; ethers such as diethyl ether, dipropyl ether, and dibutyl ether; and a mixture thereof.

The photosensitive composition may further include various additives such as a leveling agent, a coupling agent, and the like in addition to the above components as needed. The additive content is not particularly limited but may be appropriately controlled within the range which does not make unfavorable influences on the photosensitive composition and the pattern obtained therefrom.

The leveling agent prevents stains or spots and improves leveling characteristics and may include a fluorine-based leveling agent.

The fluorine-based leveling agent may include commercial products, for example BM-1000®, and BM-1100® (BM Chemie Inc.); MEGAFACE F 142D®, F 172®, F 173®, and F 183® of Dainippon Ink Kagaku Kogyo Co., Ltd.; FC-135®, FC-170C®, FC-430®, and FC-431® of Sumitomo 3M Co., Ltd.; SURFLON 5-112®, SURFLON S-113®, SURFLON S-131®, SURFLON S-141®, and SURFLON S-145® of Asahi Glass Co., Ltd.); and SH-28PA®, SH-190®, SH-193®, SZ-6032®, and SF-8428®, and the like of Toray Silicone Co., Ltd.).

The coupling agent may be used to increase adherence with a substrate and may include a silane-based coupling agent. Specific examples of the silane-based coupling agent may be vinyl trimethoxysilane, vinyl tris(2-methoxyethoxysilane), 3-glycidoxypropyl trimethoxysilane, 2-(3,4-epoxy cyclohexyl)ethyl trimethoxysilane, 3-chloropropyl methyldimethoxysilane, 3-chloropropyl trimethoxysilane, 3-methacryloxypropyl trimethoxysilane, 3-mercaptopropyl trimethoxysilane, and the like.

The photosensitive composition may be coated on a predetermined substrate using a desirable liquid coating method such as spin coating or slit coating, with a predetermined thickness, for example, about 2 micrometers (μm) to about 30 μm, to form a film. The substrate may be a glass substrate or a glass substrate coated with SiNx (a protective layer) in a predetermined thickness, for example 500 Å to 1500 Å, a silicon (Si) substrate, a silicon oxide (SiOx) substrate, or a polymer substrate. The polymer substrate may be polyethersulfone ("PES") or polycarbonate ("PC").

The formation of a film may be performed with a pre-bake (S2), if desired. The specific conditions of pre-baking such as a temperature, a time, and an atmosphere are known and may be suitably selected.

The formed (or, optionally pre-baked) film may be exposed to light having a predetermined wavelength under a mask having a predetermined pattern (S3). The wavelength and the intensity of light may be selected considering the kind and content of photoinitiator, and the kind and content of quantum dot or the like.

When the exposed film is treated with an alkali developing solution, the unexposed region in the film may be dissolved to provide a desirable pattern (S4).

A material including a high-boiling point solvent, a polyvalent metal compound solution, or a combination thereof may be coated on the patterned film to form a liquid barrier layer (S5).

The polyvalent metal compound solution may be prepared by dissolving the polyvalent metal compound in a solvent. The solvent may be a C1 to C5 alcohol such as methanol, ethanol, or butanol.

The liquid barrier layer prevents the quantum dot-polymer composite film from being exposed to oxygen and degradation of quantum dots during a subsequent process, a post-bake process. A quantum yield (luminous efficiency) of the quantum dot may be abruptly decreased by the post-bake process but the liquid barrier layer may prevent such deterioration of the quantum yield.

A film or a foil may be further disposed on the liquid barrier layer. Such a film or foil may prevent detachment of the liquid barrier layer. The film or foil may be a polymer releasing film or a metal foil, for example an aluminum foil.

The obtained patterned film may be heat-treated (post-bake, POB) as needed at a temperature, for example, greater than or equal to about 120° C. and less than about 200° C. or greater than or equal to about 140° C. and less than about 200° C., for example greater than or equal to about 170° C. and less than or equal to about 190° C. for a predetermined time, for example, greater than or equal to about 10 minutes or greater than or equal to about 20 minutes in order to improve crack resistance and solvent resistance of a pattern (S6). A heat-treatment atmosphere may be an air atmosphere and is not particularly limited. A heat-treatment (post-bake, FOB) may be performed under a nitrogen, inert, or vacuum atmosphere in order to prevent degradation of quantum dots when being exposed to air, which may increase a manufacturing cost. In addition, an inorganic barrier layer may be formed by depositing oxide or nitride layer on a patterned film. However, stability of quantum dots may be ensured but cracks of a film may occur by a difference of a coefficient of thermal expansion between the inorganic barrier layer and the patterned film and out gassing. When an organic barrier layer is formed on a patterned film, it may be difficult to remove the organic barrier layer after a FOB process. On the contrary, the liquid barrier layer may not cause the above problems when including an organic material, may be removed in a FOB process by being formed in liquid, may prevent oxygen sufficiently so as not to detract quantum dot even though being heat-treated under an air atmosphere, may suppress loss of ligands and may complement lost ligands.

A remaining material on a surface after the FOB process may be removed by washing it with a solvent such as hexane, toluene, or chloroform.

The high-boiling point solvent permeates into pores of the patterned film through a post-bake process to protect a surface of a quantum dot.

The polyvalent metal compound permeates into pores of the patterned film in a molten state through a post-bake process to protect a surface of a quantum dot and may be bound to a surface of a quantum dot to play a role of a ligand.

An embodiment provides a device including the quantum dot-polymer composite film, for example an optical device. The quantum dot-polymer composite film may be used as a quantum dot laser, an optic waveguide for an optical device, a light-emitting diode ("LED") color conversion layer, a quantum dot sheet for a liquid crystal display ("LCD") backlight, or a solar concentrating film. The patterned quantum dot-polymer composite film may have a repetitive pattern of two or more different color sections, for example, RGB color sections. The patterned quantum dot-polymer composite film may be used as a photoluminescent color filter that replaces an absorptive color filter of a liquid crystal display.

Figure 2:
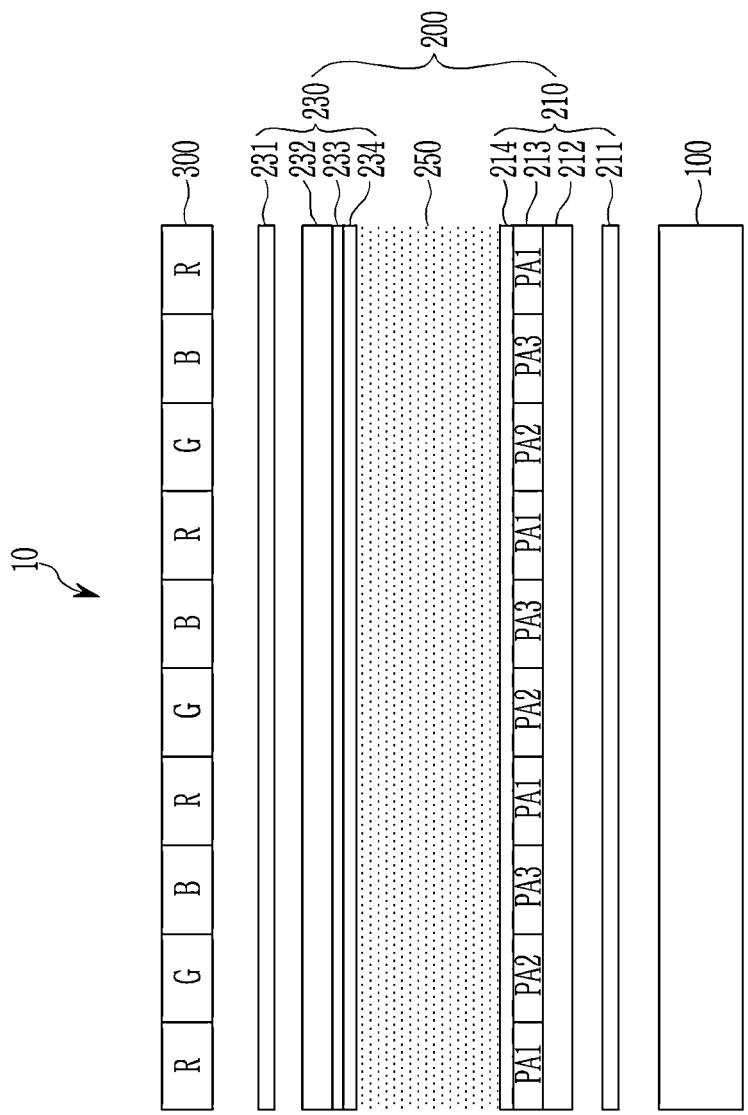
FIG. 2 is a schematic cross-sectional view of an exemplary embodiment of a liquid crystal display (LCD)

Hereinafter, a structure of a liquid crystal display is described as one example of a display device including the quantum dot-polymer composite film referring to FIG. 2. FIG. 2 is a schematic cross-sectional view of a liquid crystal display ("LCD") according to an embodiment.

Referring to FIG. 2, a liquid crystal display ("LCD") 10 includes a display panel 200 and a backlight 100. The display panel 200 includes a front plate 230 and a rear plate 210 disposed with a predetermined distance and a liquid crystal ("LC") layer 250 therebetween.

The front plate 230 includes a transparent first insulation substrate 232, a front polarizer 231 on the outer surface of the first insulation substrate 232 and a common electrode 233 and an upper alignment layer 234 sequentially stacked on the inner surface of the first insulation substrate 232. The rear plate 210 includes a transparent second insulation substrate 212, and a rear side polarizer 211 may be disposed on the outer surface of the second insulation substrate 212. In addition, a wire layer 213 including a thin-film-transistor ("TFT") switch, a pixel electrode, and the like as a liquid crystal driving circuit may be formed on the inner surface of the second insulation substrate 212, and a lower alignment layer 214 may be mounted on the wire layer 213.

On the front polarizer 231, a color filter 300 including a red emission layer (R), a green emission layer (G), and a blue emission layer (B) may be formed. In the rear plate 210, first to third pixel areas PA1, PA2, and PA3 may be defined, and the red (R), green (G), and blue (B) emission layers respectively correspond to the first to third pixel areas PA1, PA2, and PA3.

The color filter 300 may include the quantum dot-composite film.

The rear side polarizer 211 may be disposed beneath the rear plate 210, and the back light 100 may be installed beneath the rear side polarizer 211. The rear side polarizer 211 and the front polarizer 231 have perpendicularly-crossing polarization axes each other. The backlight 100 may consist of a light source and a light guide, and the light source may be positioned on the side of or under the light guide.

Figure 3:
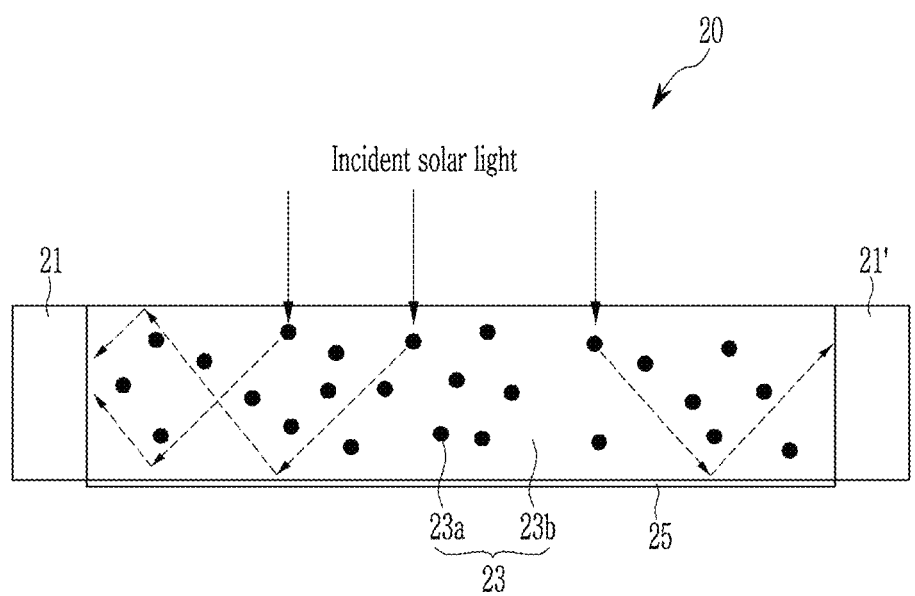
FIG. 3 is a schematic view of an exemplary embodiment of a solar cell module.

FIG. 3 shows an example of using a quantum dot-polymer composite film as a concentrating film for a solar cell module. Referring to FIG. 3, a solar cell module 20 includes a quantum dot-polymer composite film 23 including a quantum dot 23a and a polymer matrix 23b among a plurality of solar cells 21 and 21'. The quantum dot-polymer composite film 23 may be disposed among the plurality of solar cells 21 and 21' and collects incident light and then, provides the solar cells 21 and 21' with the light. A reflector 25 may be disposed under the quantum dot-polymer composite film 23 and helps the quantum dot-polymer composite film 23 efficiently collect the incident light.

Hereinafter, the embodiments are illustrated in more detail with reference to examples. However, they are exemplary embodiments, and the embodiments are not limited thereto.

EXAMPLES

Example 1

Example 1-1: Synthesis of InP/ZnSe/ZnS (Red) Quantum Dot 0.2 millimoles (mmol) of indium acetate, 0.6 mmol of palmitic acid, and 10 milliliters (mL) of 1-octadecene were put in a reactor and heated under vacuum at 120° C. After 1 hour, an atmosphere in the reactor was converted into nitrogen. After heating the reactor up to 280° C., a mixed solution of 0.07 mmol of HF/1.5 mL of trioctylamine was rapidly injected thereto, and subsequently, another mixed solution of 0.1 mmol of tris(trimethylsilyl)phosphine ($TMS_3P$) and 0.5 mL of trioctylphosphine was rapidly injected. The obtained solution was reacted for 20 minutes. After rapidly cooling down the reaction solution to room temperature, acetone was added thereto, and the mixture was centrifuged to obtain a precipitate, and the precipitate was dispersed in toluene to obtain InP toluene dispersion.

0.3 mmol (0.056 g) of zinc acetate, 0.6 mmol (0.189 g) of oleic acid, and 10 mL of trioctylamine were put in a reaction flask and vacuum-heated at 120° C. for 10 minutes. The reaction flask was internally substituted with $N_2$ and heated up to 220° C. The prepared InP semiconductor nanocrystal toluene dispersion (OD=optical density of $1^{st}$ excitonic absorption, and OD: 0.15) was added in the reaction flask within 10 seconds, 0.6 mmol of Se/TOP (Se dispersed or dissolved in trioctyl phosphine) and 0.6 mmol of S/TOP (S dispersed or dissolved in trioctyl phosphine) were added thereto together, and the mixture was heated up to 280° C. and reacted for 30 minutes. Subsequently, 0.6 mmol of S/TOP was additionally added thereto and reacted therewith for 30 minutes, the reaction solution was rapidly cooled down to room temperature, ethanol was added thereto to form a precipitate, and the precipitate was separated through centrifugation and dispersed in toluene to obtain InP/ZnSe/ZnS (red) quantum dot dispersion.

Example 1-2: Synthesis of InP/ZnSe/ZnS (Green) Quantum Dot 0.2 millimoles (mmol) of indium acetate, 0.6 mmol of palmitic acid, and 10 milliliters (mL) of 1-octadecene were put in a reactor and heated under vacuum at 120° C. After 1 hour, an atmosphere in the reactor was converted into nitrogen. After heating the reactor up to 280° C., a mixed solution of 0.07 mmol of HF/1.5 mL of trioctylamine was rapidly injected thereto, and subsequently, another mixed solution of 0.1 mmol of tris(trimethylsilyl)phosphine ($TMS_3P$) and 0.5 mL of trioctylphosphine was rapidly injected. The obtained solution was reacted for 10 minutes. Then, the subsequent processes were performed according to the same processes as in Example 1-1 to obtain InP/ZnSe/ZnS (green) quantum dot dispersion.

Example 1-3: Red Preparation of Photosensitive Composition 0.6 g of dried InP/ZnSe/ZnS (red) quantum dot prepared in Example 1-1 was dispersed in 1.2 g of chloroform, and 1.2 g of a polymeric binder solution was added thereto and mixed therewith for 1 minute to prepare quantum dot-polymeric binder dispersion liquid. The polymer in the binder solution was a quaterpolymer of methacrylic acid, benzyl methacrylate, hydroxyethylmethacrylate, and styrene (an acid value: 130 mg KOH/g and a ratio of monomers: methacrylicacid:benzylmethacrylate:hydroxy ethylmethacrylate:styrene=61.5 mol %:12 mol %:16.3 mol %:10.2 mol %), a solvent therein was polypropylene glycol monomethyl ether acetate, and a concentration of the binder solution was 30 wt %.

59.9 wt % of the quantum dot-polymeric binder dispersion liquid was mixed with 5 wt % of hexaacrylate having a structure of Chemical Formula A as a photopolymerizable monomer, 0.1 wt % of an oxime ester compound as a photoinitiator, 15 wt % of $TiO_2$ as a light scatterer, and 20 wt % of propylene glycol methyl ether acetate ("PGMEA") as a solvent to prepare a red photosensitive composition.

Chemical Formula A

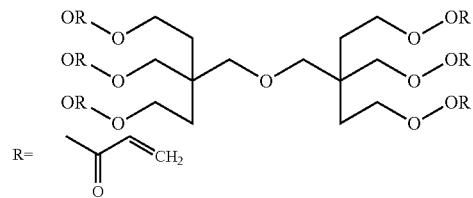

Example 1-4: Green Preparation of Green Photosensitive Composition

A green photosensitive composition was prepared according to the same method as in Example 1-3 except that InP/ZnSe/ZnS (green) quantum dot prepared in Example 1-2 was used instead of InP/ZnSe/ZnS (red) quantum dot prepared in Example 1-1.

Example 1-5: Manufacture of Quantum Dot-Polymer Composite Film

The red photosensitive composition of Example 1-2 was spin-coated to a 2 μm thickness on a glass substrate and pre-baked at 100° C. for 2 minutes. The coated substrate was radiated by light (a wavelength: 365 nm, intensity: 100 millijoules (mJ)) for 1 second under a mask having a predetermined pattern and then, developed with a potassium hydroxide aqueous solution (a concentration: 0.043 wt %) for 50 seconds to obtain a patterned film. On the patterned film, octadecene as a high-boiling point solvent was dropped and then, covered with a releasing film so that the solvent may uniformly be coated. Subsequently, the substrate was heat-treated (POB) at 180° C. in an oven under the atmosphere for 30 minutes to obtain a quantum dot-polymer composite film.

Example 2: Manufacture of Quantum Dot-Polymer Composite Film

A quantum dot-polymer composite film was manufactured according to the same method as Example 1 (specifically, Example 1-5) except for using a high vacuum grease (Dow Corning Corp.) instead of the octadecene to form a liquid barrier layer.

Example 3: Manufacture of Quantum Dot-Polymer Composite Film

A quantum dot-polymer composite film was manufactured according to the same method as Example 1 (specifically, Example 1-5) except for using silicone oil (KS-609, ShinEtsu Chemical Co., Ltd.) instead of the octadecene to form a liquid barrier layer.

Example 4: Manufacture of Quantum Dot-Polymer Composite Film

A quantum dot-polymer composite film was manufactured according to the same method as Example 1 (specifically, Example 1-5) except for using an ionic liquid of 1-butyl-3-methylimidazolium hexafluorophosphate instead of the octadecene to form a liquid barrier layer.

Example 5: Manufacture of Quantum Dot-Polymer Composite Film

A quantum dot-polymer composite film was formed according to the same method as Example 1 (specifically, Example 1-5) except for using trioctylamine instead of the octadecene to form a liquid barrier layer.

Example 6: Manufacture of Quantum Dot-Polymer Composite Film

The red photosensitive composition prepared in Example 1-3 was spin-coated to a 2 μm thickness on a glass substrate and pre-baked at 100° C. for 2 minutes. The coated substrate was radiated by light (a wavelength: 365 nm, intensity: 100 mJ) for 1 second under a mask having a predetermined pattern and then, developed with a potassium hydroxide aqueous solution (a concentration: 0.043 wt %) for 50 seconds to form a patterned film. Subsequently, a solution obtained by dissolving Zn oleate with a concentration of 10 wt % in trioctylamine was dropped on the patterned film and then, covered with a releasing film so that the solution may uniformly be coated. Then, the obtained substrate was heat-treated (POB) at 180° C. in an oven under the atmosphere for 30 minutes to obtain a quantum dot-polymer composite film.

Examples 7 to 10: Manufacture of Quantum Dot-Polymer Composite Film

The red photosensitive composition prepared in Example 1-3 was spin coated on a glass substrate to obtain a film. The film was pre-baked at 100° C. for 2 minutes. The pre-baked film was radiated by light (a wavelength: 365 nm, intensity: 100 mJ) for 1 second under a mask having a predetermined pattern and then, developed with a potassium hydroxide aqueous solution (a concentration: 0.043 wt %) for 50 seconds to form a patterned film. On the patterned film, solutions obtained by dissolving the metal salts with each wt % concentration described in Table 1 in butanol were respectively coated and allowed to stand for 1 minute, and metal salt-butanol solution on the surface of the film was removed at 2000 rotations per minute (rpm) for 20 seconds with a spin-coater. Subsequently, the obtained film was heat-treated (POB) at 180° C. for 30 minutes in an oven under the atmosphere to obtain a quantum dot-polymer composite film.

TABLE 1

|  | Metal salt | Amounts relative to solution (wt %) |
|---|---|---|
| Example 7 | $ZnCl_2$ | 7 |
| Example 8 | $InCl_3$ | 11 |
| Example 9 | $GaCl_3$ | 9 |
| Example 10 | $MgCl_2$ | 5 |

Comparative Example 1: Manufacture of Quantum Dot-Polymer Composite Film

A quantum dot-polymer composite film was manufactured according to the same method as Example 1 (specifically, Example 1-5) except for forming no liquid barrier layer.

Example 11: Manufacture of Quantum Dot-Polymer Composite Film

A solution obtained by dissolving Zn oleate with a concentration of 10 wt % in trioctylamine was coated on the quantum dot-polymer composite film according to Comparative Example 1 and then was heat-treated (POB) at 180° C. in an oven under the atmosphere for 30 minutes.

Photoconversion efficiency of the quantum dot-polymer composite films according to Examples 1 to 10 and Comparative Example 1 before/after the heat treatment (POB) was measured, and its maintenance rate was evaluated. The photoconversion efficiency was obtained by measuring luminous efficiency of the quantum dot-polymer composite films at about 450 nm blue excitation by using CAS 140CT Array Spectrometer (Instrument Systems Inc.). The maintenance rate was calculated according to Equation 1.

[Photoconversion efficiency after heat treatment (POB)/Photoconversion efficiency before heat treatment (POB)]×100%     Equation 1

Figure 4:
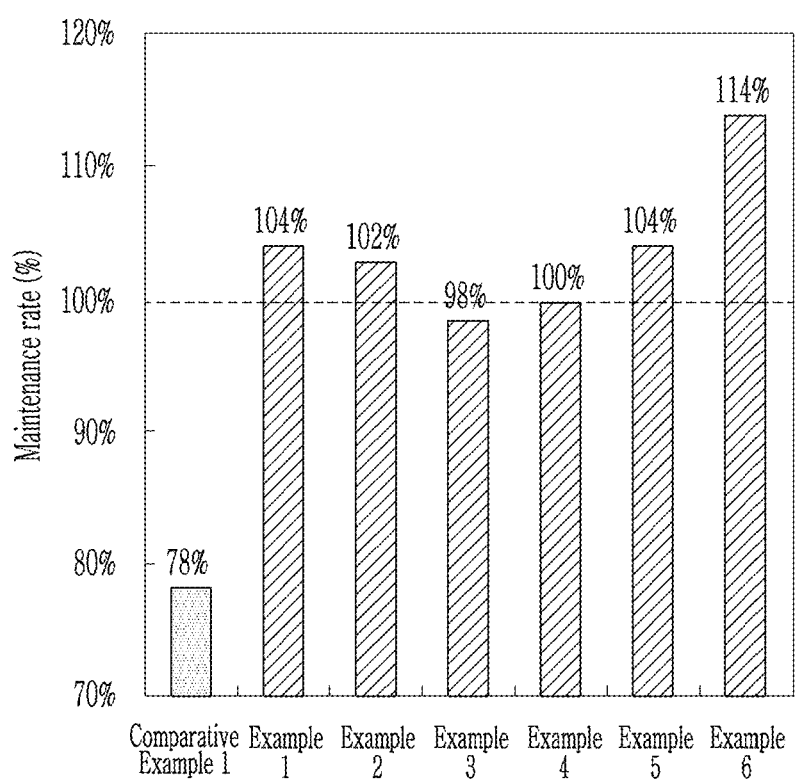
FIG. 4 is a graph showing maintenance rates of photoconversion efficiency before/after heat treatment (post-bake, POB) of the quantum dot-polymer composite films according to Examples 1 to 6 and Comparative Example 1.
Figure 5:
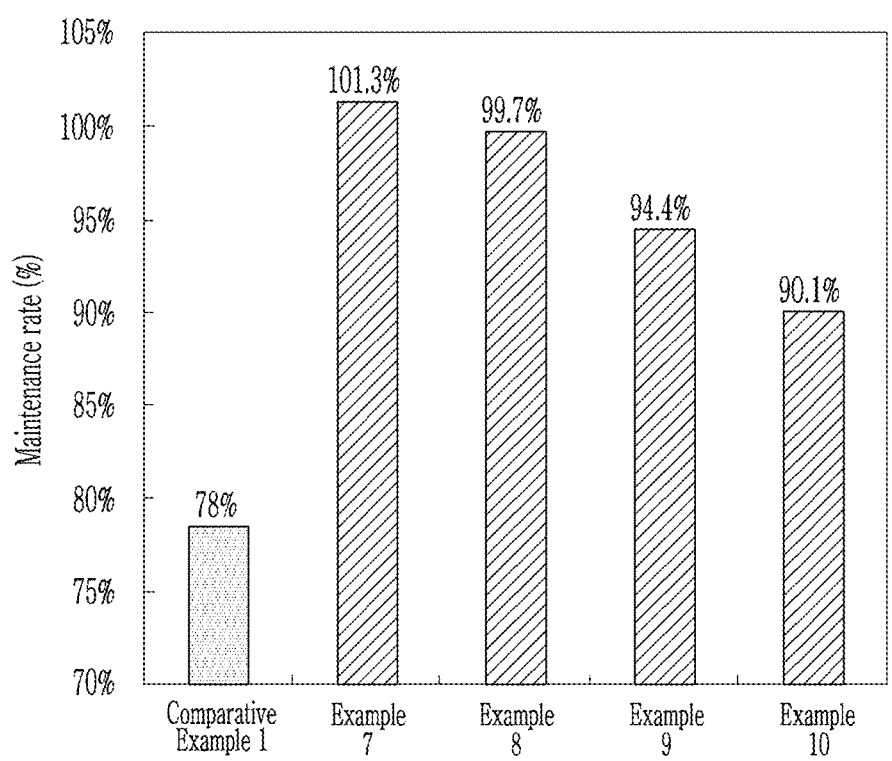
FIG. 5 is a graph showing maintenance rates of photoconversion efficiency before/after heat treatment (POB) of the quantum dot-polymer composite films according to Examples 7 to 10 and Comparative Example 1.

The results are shown in FIGS. 4 and 5. FIG. 4 is a graph showing a maintenance rate of photoconversion efficiency before/after heat treatment (POB) of the quantum dot-polymer composite films according to Examples 1 to 6 and Comparative Example 1. FIG. 5 is a graph showing a maintenance rate of photoconversion efficiency before/after heat treatment (POB) of the quantum dot-polymer composite films according to Examples 7 to 10 and Comparative Example 1.

Referring to FIG. 4, the quantum dot-polymer composite films according to Examples 1 to 6 exhibited greater than or equal to 20% improved maintenance rates compared with the quantum dot-polymer composite film according to Comparative Example 1. In addition, the quantum dot-polymer composite films according to Examples 1, 2, 5, and 6 exhibited more increased photoconversion efficiency after the FOB than those before the FOB.

Referring to FIG. 5, the quantum dot-polymer composite films of Examples 7 to 10 exhibited greater than or equal to 12.1% improved maintenance rates than that of Comparative Example 1. In addition, the quantum dot-polymer composite film of Example 7 exhibited improved photoconversion efficiency after FOB than that before the FOB.

Figure 6:
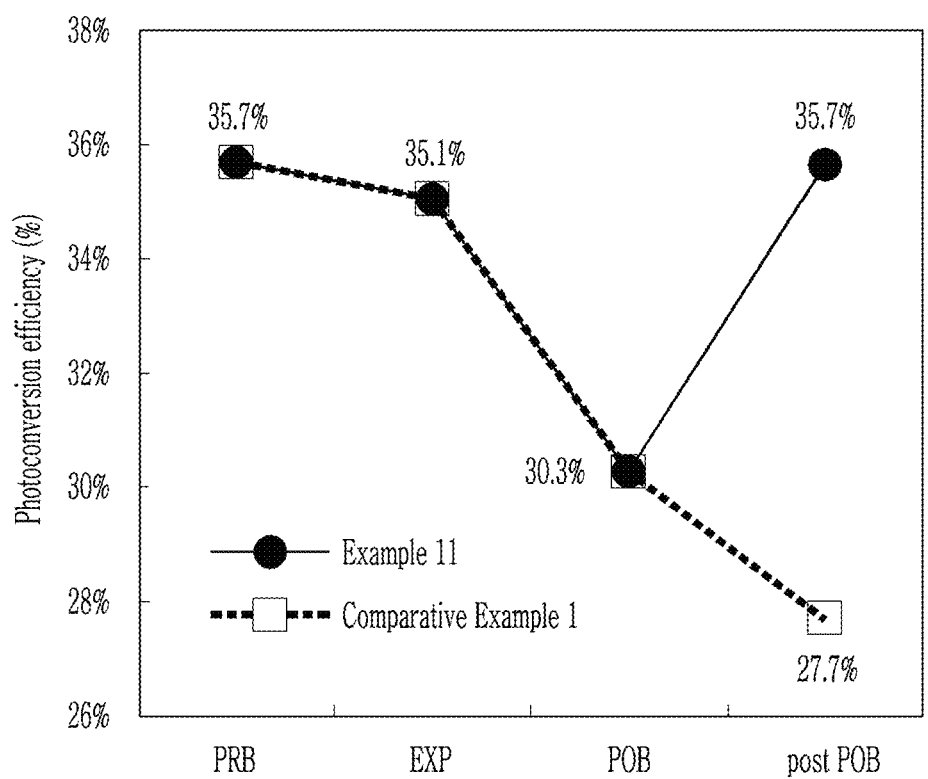
FIG. 6 is a graph showing photoconversion efficiency of the quantum dot-polymer composite films according to Example 11 and Comparative Example 1 at each step.

In order to confirm an effect of protecting quantum dots of a liquid barrier layer, photoconversion efficiency of the quantum dot-polymer composite film according to Example 11 at each step was evaluated and the results were shown in FIG. 6. For comparison, photoconversion efficiency of the quantum dot-polymer composite film according to Comparative Example 1 at each step was also shown. Referring to FIG. 6, photoconversion efficiency of the quantum dot-polymer composite film according to Comparative Example 1 was 30.3%. The photoconversion efficiency was decreased to 27.7% after additionally heat-treating (post POB) at 180° C. in an oven under the atmosphere for 30 minutes while the photoconversion efficiency of the quantum dot-polymer composite film according to Example 11 was increased up to 35.7% after additionally heat-treating (post POB) at 180° C. in an oven under the atmosphere for 30 minutes. Accordingly, the solution obtained by dissolving the Zn oleate with a concentration of 10 wt % in trioctylamine provides a ligand passivating defects on the surface of quantum dots and removing traps on the surface of quantum dots.

Figure 7:
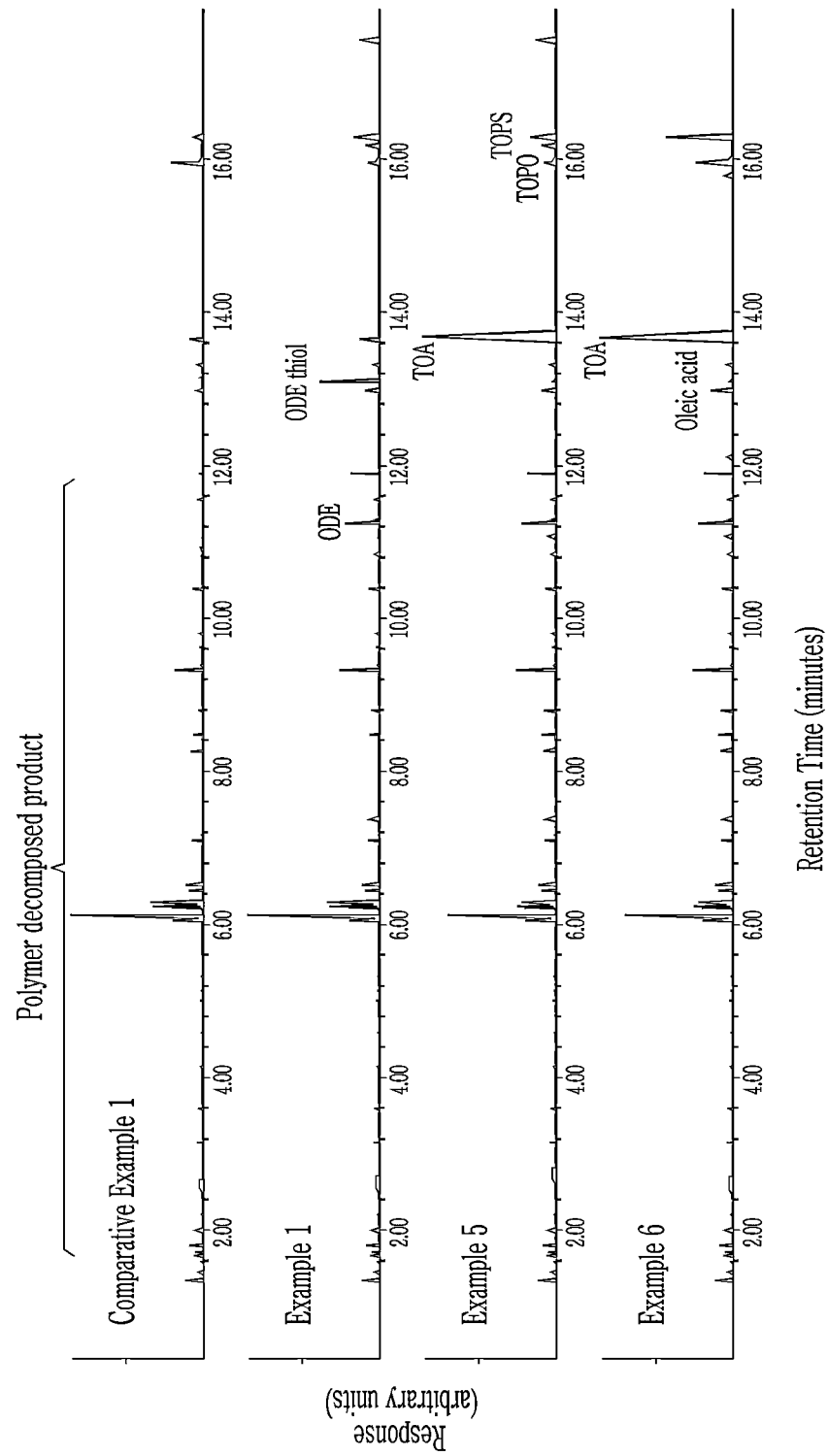
FIG. 7 is a graph of response (arbitrary units) versus retention time (minutes) showing the results of gas chromatography/mass spectroscopy analysis ("GC/MS") analysis of the quantum dot-polymer composite films according to Comparative Example 1, Example 1, Example 5, and Example 6.

Residues of the liquid barrier layers of the quantum dot-polymer composite films according to Examples 1, 5, and 6 was examined through a gas chromatography/mass spectroscopy analysis ("GC/MS"), and the results are shown in FIG. 7. FIG. 7 is a graph showing the gas chromatography/mass spectroscopy analysis ("GC/MS") results of the quantum dot-polymer composite films according to Comparative Example 1, Example 1, Example 5, and Example 6. Referring to FIG. 7, the quantum dot-polymer composite films according to Examples 1, 5, and 6 exhibited a peak corresponding to a residue of a liquid barrier layer.

Figure 8:
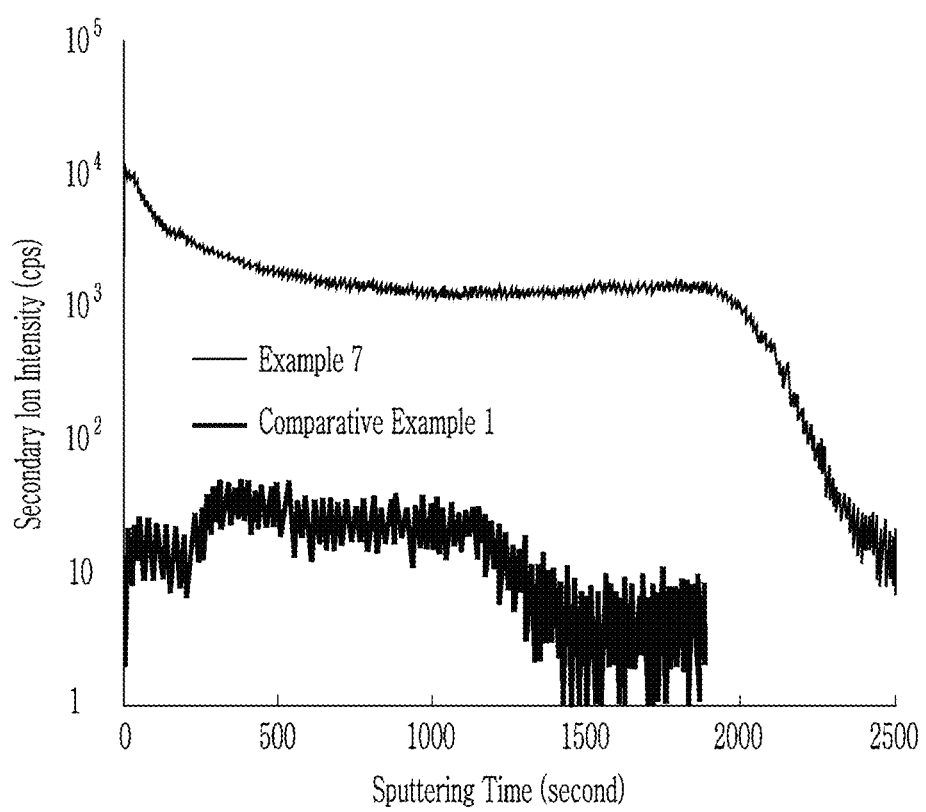
FIG. 8 is a graph of secondary ion intensity (counts per second, cps) versus sputtering time (seconds) showing the results of time-of-flight secondary ion mass spectroscopy ("ToF-SIMS") analysis of the quantum dot-polymer composite films according to Example 7 and Comparative Example 1.

A ToF-SIMS analysis was performed to examine a residue of a liquid barrier of the quantum dot-polymer composite film according to Example 7, and the results are shown in FIG. 8. The ToF-SIMS analysis results of the quantum dot-polymer composite film according to Comparative Example 1 are shown together for comparison. FIG. 8 is a graph showing the ToF-SIMS analyses results of the quantum dot-polymer composite films according to Example 7 and Comparative Example 1. Referring to FIG. 8, since chlorine was detected all over the quantum dot-polymer composite film according to Example 7 in the ToF-SIMS analysis, $ZnCl_2$ turns out generally permeated into the quantum dot-polymer composite film and present thereinside. On the contrary, components of the photosensitive composition of the quantum dot-polymer composite film according to Comparative Example 1 were detected.

Figure 9:
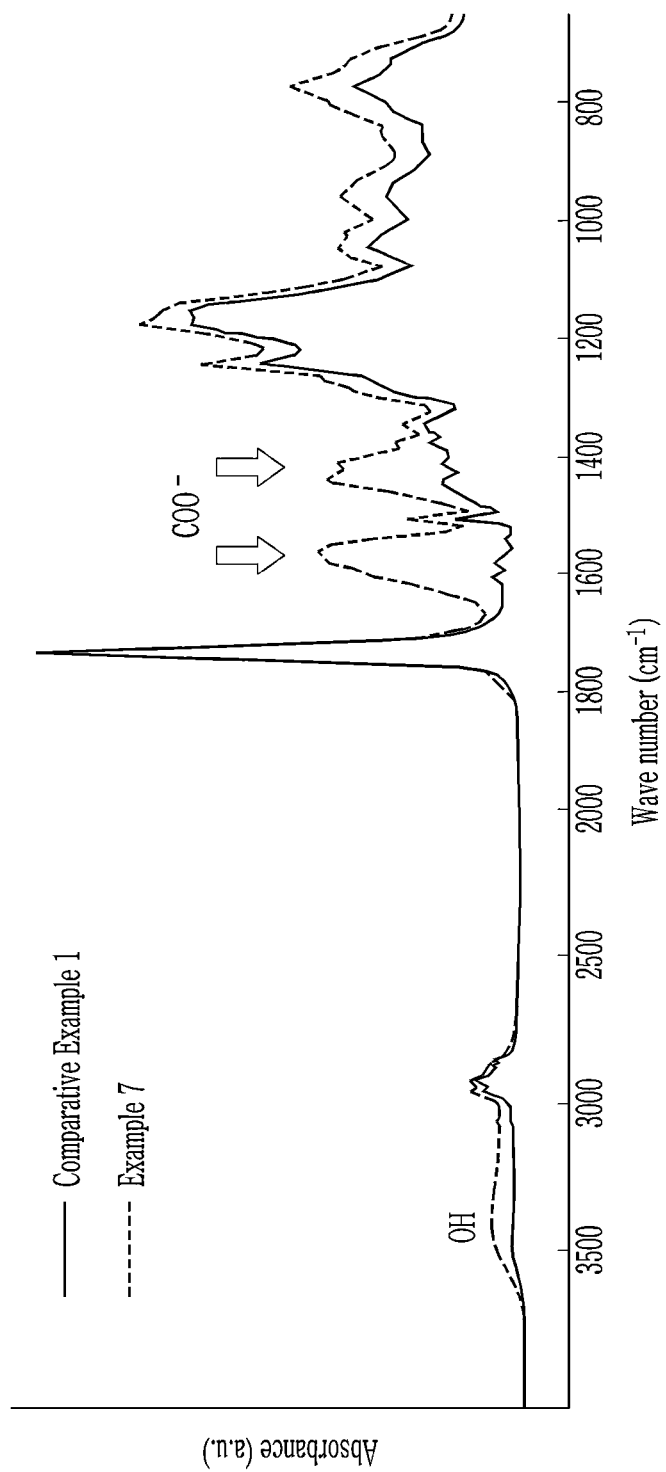
FIG. 9 is a graph of absorbance (arbitrary units, a.u.) versus wave number (cm$^{-1}$) showing the results of infrared ray spectroscopy ("FT-IR") analysis of the quantum dot-polymer composite films according to Example 7 and Comparative Example 1.

The FT-IR analysis results of the quantum dot-polymer composite films according to Example 7 and Comparative Example 1 are shown in FIG. 9. FIG. 9 is a graph showing the FT-IR analyses results of the quantum dot-polymer composite films according to Example 7 and Comparative Example 1. Referring to FIG. 9, a peak corresponding to a carboxylate ion group was found in the quantum dot-polymer composite film according to Example 7, but a peak corresponding to a carboxyl group was found in the quantum dot-polymer composite film according to Comparative Example 1. The carboxylate ion group is regarded as having been produced through a bond with Zn in the liquid barrier layer.

Residue Evaluation on the Surface of Quantum Dot-Polymer Composite Film

The green photosensitive composition according to Example 1-4 was respectively spin-coated on each quantum dot-polymer composite film (a first film) according to Examples 1 to 10 and Comparative Example 1 to obtain a film (a second film). The second film was prebaked at 100° C. for 2 minutes. Subsequently, a potassium hydroxide aqueous solution (a concentration: 0.043 wt %) was used to wash the obtained films for 50 seconds to examine whether or not residues of the second film remains on the first films.

Figure 10:
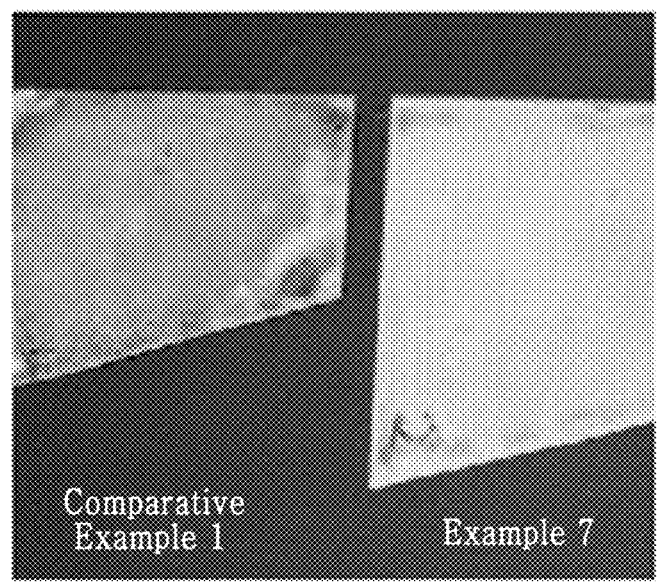
FIG. 10 is photographs of the quantum dot-polymer composite films according to Example 7 and Comparative Example 1 after removing the second film.
Figure 11:
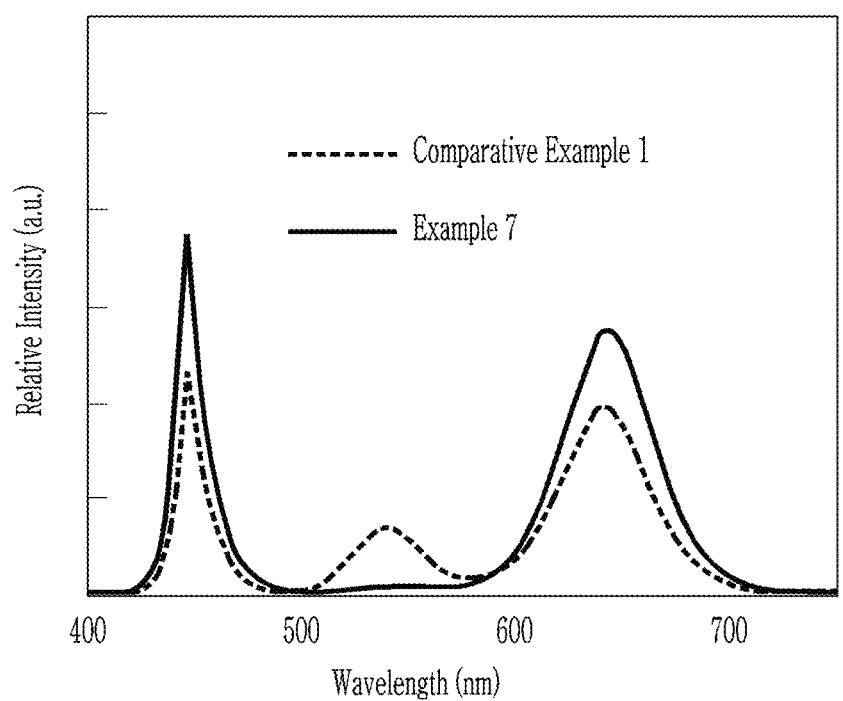
FIG. 11 is a graph showing photoluminescence intensity of the quantum dot-polymer composite films according to Example 7 and Comparative Example 1 after removing the second film.

Residues on the surface of the quantum dot-polymer composite films according to Example 7 and Comparative Example 1 were shown in FIG. 10. FIG. 10 is a photograph showing the quantum dot-polymer composite films according to Example 7 and Comparative Example 1 after removing the second film. Referring to FIG. 10, as for the quantum dot-composite film according to Comparative Example 1, a plenty of residues of the second film remained, but as for the quantum dot-composite film according to Example 7, the second film was clearly removed. Photoluminescence intensity of the quantum dot-polymer composite films according to Example 7 and Comparative Example 1 (by using a light source having a light emitting wavelength of 450 nm) after respectively removing the second film was measured, and the results are shown in FIG. 11. FIG. 11 is a graph showing photoluminescence intensity of the quantum dot-polymer composite films according to Example 7 and Comparative Example 1 after removing the second film. Referring to FIG. 11, the quantum dot-polymer composite film according to Comparative Example 1 exhibited photoluminescence intensity in a green light emitting region, but the quantum dot-polymer composite film according to Example 7 exhibited no photoluminescence intensity in the green light emitting region. Accordingly, the second film on the quantum dot-polymer composite film according to Example 7 was clearly removed.

FIGS. 10 and 11 exhibited that the quantum dot-composite film according to Example 7 had photoresist patterning characteristics.

Examples 12 to 15: Manufacture of Light Emitting Diode

The quantum dot according to Example 1-1 was washed and dried and then, added to a chloroform solvent to prepare an about 1 wt % quantum dot solution. On the other hand, a silicone resin was prepared by mixing EG6301 Å and EG6301 B manufactured by Dow Corning Corp. in a volume ratio of 1:1 and removing a vapor therefrom. 100 microliters of the quantum dot solution and 0.5 g of the silicone resin are stirred and uniformly mixed, and the mixture was maintained under vacuum for about 1 hour to remove the chloroform solvent to prepare a composition for a light conversion layer. 200 µL of the composition for a light conversion layer was mounted on a blue LED chip having a light emitting wavelength of 450 nm and driven at 50 mA and then was photocured by radiating UV light with 1000 $mJ/cm^2$. Then, the solutions obtained by dissolving metal salts in a wt % concentration as shown in Table 1 in butanol were respectively coated thereon and allowed to stand for 5 minutes and then, heat-treated under an air atmosphere at 120° C. for 30 minutes in an oven to manufacture each light emitting diode including a light conversion layer.

Comparative Example 2: Manufacture of Light Emitting Diode

A light emitting diode mounted with a quantum dot-polymer composite was manufactured according to the same method as Example 12 except for using no solution obtained by dissolving metal salts in a wt % concentration as shown in Table 1 in butanol.

Figure 12:
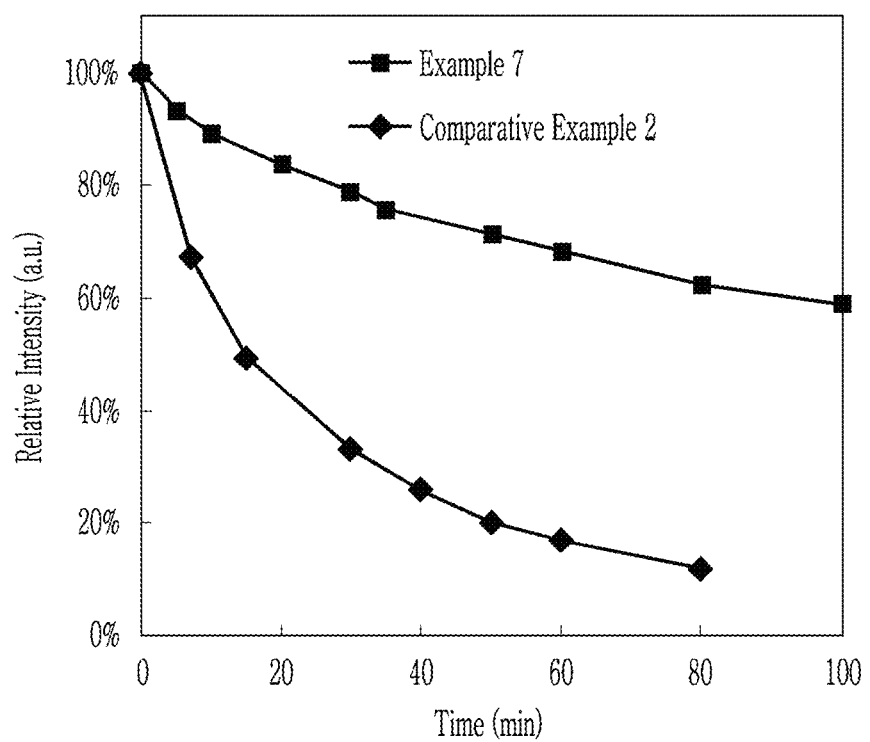
FIG. 12 is is a graph showing photoluminescence intensity of the light emitting diodes according to Example 12 and Comparative Example 2.

The light emitting diodes according to Examples 12 to 15 and Comparative Example 2 were operated to measure photoluminescence intensity depending on a time. FIG. 12 shows photoluminescence intensity of light emitting diodes according to Example 12 and Comparative Example 2.

Referring to FIG. 12, the light emitting diode according to Example 12 maintained excellent photoluminescence intensity compared with LED according to Comparative Example 2.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot-polymer composite film, comprising:
    a plurality of quantum dots, wherein a quantum dot of the plurality of quantum dots comprises an organic ligand on a surface of the quantum dot;
    a cured product of a photopolymerizable monomer comprising a carbon-carbon unsaturated bond; and
    a residue of a solvent with a high-boiling point of about 200° C. to about 350° C., and optionally, a residue of a polyvalent metal compound.

2. The quantum dot-polymer composite film of claim 1, wherein the quantum dot comprises a Group II-VI compound, a Group III-V compound, a Group IV-VI compound, a Group IV element or compound, a Group I-III-VI compound, a Group I-II-IV-VI compound, or a combination thereof.

3. The quantum dot-polymer composite film of claim 1, wherein the organic ligand comprises RC(=O)OH, RC(=O)OM, RNH$_2$, R$_2$NH, R$_3$N, RSH, RSM, R$_3$PO, R$_3$P, ROH, RP(=O)(OH)$_2$, R$_2$P(=O)OH, R$_2$NC(=S)SM, wherein each R is independently a C5 to C24 alkyl group, a C5 to C24 alkenyl group, or a C6 to C20 aryl group, and wherein M is a monovalent metal, a polymeric organic ligand, or a combination thereof.

4. The quantum dot-polymer composite film of claim 1, wherein the photopolymerizable monomer comprising the carbon-carbon unsaturated bond comprises a di(meth)acrylate compound, a tri(meth)acrylate compound, a tetra(meth)acrylate compound, a penta(meth)acrylate compound, a hexa(meth)acrylate compound, or a combination thereof.

5. The quantum dot-polymer composite film of claim 1, wherein the cured product of the photopolymerizable monomer comprising the carbon-carbon unsaturated bond is a cured product of the photopolymerizable monomer comprising a carbon-carbon unsaturated bond and a thiol compound having at least two thiol groups.

6. The quantum dot-polymer composite film of claim 1, wherein the high-boiling point solvent comprises a compound having a boiling point of about 250° C. to about 300° C.

7. The quantum dot-polymer composite film of claim 1, wherein the high-boiling point solvent comprises a C6 to C20 aliphatic hydrocarbon compound, a C6 to C20 ether compound, a C6 to C20 amine compound, a C6 to C20 alcohol compound, a carbitol compound, vacuum grease, an ionic liquid, or a combination thereof.

8. The quantum dot-polymer composite film of claim 1, wherein the high-boiling point solvent comprises octadecene, dodecene, tetradecane, octyl ether, phenyl ether, trioctylamine, oleyl amine, diethanol amine, triethanol amine, oleyl alcohol, glycerine, diethylene glycol, tripropylene glycolmethylether, ethyl carbitol acetate, butyl carbitol acetate, or a combination thereof.

9. The quantum dot-polymer composite film of claim 1, wherein the polyvalent metal compound comprises Zn, In, Ga, Mg, Ca, Sc, Sn, Ti, V, Cr, Mn, Fe, Co, Ni, Cu, Sr, Y, Zr, Nb, Mo, Cd, Ba, Au, Hg, Tl, or a combination thereof.

10. The quantum dot-polymer composite film of claim 1, wherein the polyvalent metal compound comprises an organometallic compound, an organic salt, an inorganic salt, or a combination thereof.

11. The quantum dot-polymer composite film of claim 1, wherein the polyvalent metal compound comprises a metal halide, a metal alkylate, a metal carboxylate, a metal (meth)acrylate, a metal dialkyl dithiocarbamate, a metal chalcogenide, or a combination thereof.

12. The quantum dot-polymer composite film of claim 1, wherein the polyvalent metal compound comprises zinc chloride, indium chloride, cadmium chloride, aluminum chloride, iron chloride, manganese chloride, diethyl zinc, dipropyl zinc, dibutyl zinc, triethyl aluminum, tributyl aluminum, zinc carboxylate, zinc diethyl dithiocarbamate, indium acetate, or a combination thereof.

13. The quantum dot-polymer composite film of claim 1, wherein the quantum dot-polymer composite film comprises about 1 weight percent to about 50 weight percent of the quantum dots; about 0.5 weight % to about 30 weight % of the cured product of the photopolymerizable monomer; and about 0.01 weight % to about 15 weight % of the residue, based on a total weight of the quantum dot-polymer composite film.

14. The quantum dot-polymer composite film of claim 1, wherein the quantum dot-polymer composite film further comprises a polymeric binder.

15. The quantum dot-polymer composite film of claim 14, wherein the polymeric binder comprises an acryl polymeric binder, a cardo polymeric binder, or a combination thereof.

16. The quantum dot-polymer composite film of claim 4, wherein the polymeric binder has an acid value of about 30 milligrams KOH/gram to about 200 milligrams KOH/gram.

17. The quantum dot-polymer composite film of claim 4, wherein the polymeric binder has a weight average molecular weight of about 1,000 grams per mole to about 150,000 grams per mole.

18. The quantum dot-polymer composite film of claim 14, wherein the quantum dot-polymer composite film comprises the residue of a polyvalent metal compound, and the polymeric binder comprises a carboxylate ion group of the formula —C(=O)O$^-$.

19. The quantum dot-polymer composite film of claim 1, wherein the quantum dot-polymer composite film further comprises a light scatterer comprising a metal oxide particle, a metal particle, or a combination thereof.

* * * * *